(12) United States Patent
Medelius et al.

(10) Patent No.: US 8,593,153 B2
(45) Date of Patent: Nov. 26, 2013

(54) METHOD OF FAULT DETECTION AND REROUTING

(75) Inventors: Pedro J. Medelius, Merritt Island, FL (US); Tracy L. Gibson, Melbourne, FL (US); Mark E. Lewis, Merritt Island, FL (US)

(73) Assignee: The United States of America as Represented by the United States National Aeronautics and Space Administration, Washington, DC (US)

( * ) Notice: Subject to any disclaimer, the term of this patent is extended or adjusted under 35 U.S.C. 154(b) by 545 days.

(21) Appl. No.: 12/843,382

(22) Filed: Jul. 26, 2010

(65) Prior Publication Data

US 2011/0210750 A1 Sep. 1, 2011

Related U.S. Application Data

(60) Provisional application No. 61/308,664, filed on Feb. 26, 2010.

(51) Int. Cl.
*G01R 31/02* (2006.01)

(52) U.S. Cl.
USPC .......................... 324/543; 324/555; 324/718

(58) Field of Classification Search
USPC ......... 324/543, 539, 537, 500, 555, 456, 237, 324/238, 240, 216, 718; 702/1, 33, 35
See application file for complete search history.

(56) References Cited

U.S. PATENT DOCUMENTS

| | | | |
|---|---|---|---|
| 4,887,041 A * | 12/1989 | Mashikian et al. | ........... 324/533 |
| 4,988,949 A | 1/1991 | Boenning | |
| 5,132,490 A | 7/1992 | Aldissi | |
| 5,317,109 A | 5/1994 | Aldissi | |
| 5,714,885 A * | 2/1998 | Lulham | .......... 324/529 |
| 5,841,617 A | 11/1998 | Watkins | |
| 5,862,030 A * | 1/1999 | Watkins et al. | ............... 361/103 |
| 5,994,790 A | 11/1999 | Nagashima | |
| 6,512,444 B1 | 1/2003 | Morris | |
| 6,625,550 B1 | 9/2003 | Scott | |
| 6,741,081 B1 | 5/2004 | Eslambolchi | |
| 6,782,329 B2 | 8/2004 | Scott | |
| 6,853,196 B1 * | 2/2005 | Barnum et al. | ............... 324/543 |
| 6,859,041 B2 * | 2/2005 | Styles | ........... 324/523 |
| 7,076,374 B2 | 7/2006 | Rogovin | |
| 7,236,338 B2 | 6/2007 | Hale | |
| 7,277,822 B2 * | 10/2007 | Blemel | ......... 702/183 |
| 7,427,867 B2 | 9/2008 | Haynes | |
| 7,437,934 B2 * | 10/2008 | Shoureshi | ....... 73/643 |
| 7,902,832 B2 * | 3/2011 | Shimamura et al. | .......... 324/539 |

(Continued)

OTHER PUBLICATIONS

Qiu, HJ and MX Wan, Nanostructures of polyaniline doped with a novel dopant. Mater Phys. Mech. 4:125-128 (2001).

(Continued)

*Primary Examiner* — Hoai-An D Nguyen
(74) *Attorney, Agent, or Firm* — Michelle L. Ford; Hugh McTavish

(57) ABSTRACT

A system and method for detecting damage in an electrical wire, including delivering at least one test electrical signal to an outer electrically conductive material in a continuous or non-continuous layer covering an electrically insulative material layer that covers an electrically conductive wire core. Detecting the test electrical signals in the outer conductive material layer to obtain data that is processed to identify damage in the outer electrically conductive material layer.

20 Claims, 13 Drawing Sheets

(56) References Cited

U.S. PATENT DOCUMENTS

| | | | |
|---|---|---|---|
| 8,063,645 B2* | 11/2011 | Ravot et al. | 324/539 |
| 2003/0125893 A1* | 7/2003 | Furse | 702/108 |
| 2004/0183545 A1 | 9/2004 | Eslambolchi | |
| 2005/0057869 A1* | 3/2005 | Hale et al. | 361/64 |
| 2006/0061368 A1* | 3/2006 | Furse et al. | 324/519 |
| 2008/0212246 A1 | 9/2008 | Tanaka | |
| 2009/0287426 A1* | 11/2009 | Kukowski | 702/35 |

OTHER PUBLICATIONS

Zhang, Y. et al. Determination of dopamine in the presence of ascorbic acid by poly(styrene sulfonic acid) Anal. Biochem. 350:285-291 (2006).

Peng, F. Sulfonated carbon nanotubes as a strong protonic acid catalyst. Carbon 43:2405-2408 (2005).

* cited by examiner

METHOD OF FAULT DETECTION AND REROUTING

CROSS-REFERENCE TO RELATED APPLICATIONS

This application is related to co-pending applications referenced as KSC-13336 entitled "Electrically Conductive Composite Material" and KSC-12866 entitled "In-Situ Wire Damage Detection System" filed concurrently, and claims the benefit under 35 U.S.C. §119(e) of U.S. Provisional Application Ser. No. 61/308,664 filed on Feb. 26, 2010, the contents of which are incorporated herein by reference.

BACKGROUND OF THE INVENTION

Faults in electrical wiring are a serious concern, especially for the aerospace and aeronautical industries. There are a number of airplane and spacecraft accidents that have occurred as a result of faulty wiring creating shorts or opens, resulting in loss of control of the aircraft or in arcing leading to fires and explosions. TWA flight 800 is one example where an electrical wire failure resulted in the loss of many lives. Wire and cable testing is usually performed on the ground after the crew reports an anomaly encountered in flight, but often such failures appear as the result of vibration and cannot be seen while the aircraft is stationary. Today's testing methods regularly require removing wires or cables to inspect them, which can be expensive and labor intensive. It would be desirable to measure wire performance in situ without removing them. It would also be desirable to detect core wire damage during operation, i.e., on a live wire. It would also be desirable to detect damage before a wire completely fails, e.g., to detect damage to the insulation layer of a wire before the insulation layer is completely cut and exposes the wire core to a short or an open.

Wires are often bundled to connect complex electronics or multiple load devices. Wires in cables or other wire bundles sometimes chafe against each other or otherwise wear the insulation to develop arcs and other types of faults, opens, or shorts. Many of these faults are not detected until a complete failure of one or more devices occurs. It can be labor intensive and difficult to test each wire in a bundle even when damage is known to have occurred, and often not feasible to test for damage before complete failure occurs. Previous methods of detecting damage to wires in bundles often were not able to monitor damage in real time and could not detect intermittent damage or determine the extent of the damage. It would be desirable to detect damage in wire bundles when it first occurs, on live wires, e.g., during a flight in the case of wires on an airplane, and be able to immediately identify the damaged wire. It would also be desirable to be able to take action immediately when damage is detected.

SUMMARY OF THE INVENTION

The inventors have developed electrical wires that can be used in a system to detect damage to the outer layers of the wire before the core conductor of the wire is damaged. One embodiment of the invention involves an electrical wire having (a) an electrically conductive wire core, covered with (b) an electrically insulative material layer, completely or partially covered with (c) an electrically conductive material layer (a detection layer), covered with (d) an electrically insulative layer. Thus, there is an outer electrically conductive detection layer in addition to the electrically conductive wire core. New materials and designs for the outer electrically conductive layer are provided with the level of conductivity and other traits needed for the self-detecting wires.

The wires are linked to an electrical signal generator that delivers an electrical signal (a voltage or current) to the conductive outer detection layer. A detector circuit detects and measures characteristics of the electrical signals in the outer detection layer to detect damage to the outer detection layer. In this way, damage to the wire, including potentially early damage to the insulation layer or damage to the wire core, is detected. If the damage happens gradually, damage to the outer conductive layer can be detected before the wire core fails or in some cases even is damaged. New methods of detecting damage to an electrical wire or other materials are also provided.

The embodiments are generally directed to systems for detecting damage in electrical wires or damage to other substrates, which could include flat surfaces such as solar panels or inflatable structures. Other embodiments are directed to electrical wires for use in the systems. Other embodiments are directed to novel materials for use in the wires and systems. Other embodiments are directed to methods of detecting damage to an electrical wire or methods of detecting damage to other substrates or objects.

One embodiment of the invention provides an electrical wire comprising: (a) an electrically conductive wire core, covered with (b) an electrically insulative material layer, completely or partially covered with (c) an electrically conductive material layer, covered with (d) an electrically insulative layer; wherein layer (c) is (i) a composite material comprising a conductive polymer having amino groups or cationic groups, and carbon nanotubes covalently modified with acidic groups or hydroxyls; (ii) a material comprising metalized carbon fibers; or (iii) a thin metal coating.

One embodiment of the invention provides a damage detection system comprising: (a) an electrically conductive wire core, covered with (b) an electrically insulative material layer, completely or partially covered with (c) an electrically conductive material layer, covered with (d) an electrically insulative layer; wherein layer (c) is electrically connected to (e) an electrical signal generator adapted to deliver electrical signals to layer (c); and (f) a detector circuit electrically linked to (c) and adapted to detect the electrical signals in layer (c) and process data about the electrical signals in layer (c) to identify flaws in at least one layer of the system; wherein layer (c) is (i) a composite material comprising a conductive polymer having amino groups or cationic groups, and carbon nanotubes covalently modified with acidic groups or hydroxyls; (ii) a material comprising metalized carbon fibers; (iii) a thin metal coating; or (iv) a composite material comprising a conductive polymer and metal nanoparticles.

One embodiment provides a damage detection system comprising: (a) a substrate; completely or partially covered with (b) a layer comprising an electrically conductive material forming a continuous or noncontinuous layer; wherein layer (b) is electrically connected to (c) an electrical signal generator adapted to deliver electrical signals to layer (b); and (d) a detector circuit electrically linked to (b) and adapted to detect the electrical signals in layer (b) and process data about the electrical signals in layer (b) to identify damage to the substrate (a) or electrically conductive material (b); wherein the electrically conductive material of layer (b) is (i) a composite material comprising a conductive polymer having amino groups or cationic groups, and carbon nanotubes covalently modified with acidic groups or hydroxyls; (ii) a material comprising metalized carbon fibers; (iii) a thin metal coating less than 20 microns thick; wherein the substrate is not an electrically conducting wire core; or (iv) a composite material comprising a conductive polymer and metal nanoparticles.

In other embodiments, the electrically conductive material of layer (b) is (i) a composite material; (ii) a material comprising metalized carbon fibers; (iii) a thin metal coating; (iv) a conductive polymer; (v) carbon nanotubes; (vi) metal nanoparticles; or (vii) a combination thereof.

Another embodiment provides a composite material comprising: electrically conductive metalized carbon fibers coated with an electrically insulative polymer.

Another embodiment provides a wire comprising an electrically conductive wire core surrounded by an electrically insulative layer; wherein the electrically conductive wire core is metalized carbon fibers and the electrically insulative layer is an electrically insulative polymer.

Another embodiment provides a composite material comprising: (i) a conductive polymer having amino groups or cationic groups; and (ii) carbon nanotubes covalently modified with acidic groups or hydroxyls.

Another embodiment provides a method of detecting damage comprising: (a) delivering one or more test electrical signals to an electrically conductive material in a continuous or noncontinuous layer covering a substrate; (b) detecting the electrical signals in the electrically conductive material layer to obtain data about the electrical signals in the electrically conductive material layer; (c) processing the data to identify damage in the electrically conductive material layer or the substrate; (d) wherein the electrically conductive material layer is (i) a composite material; (ii) a material comprising metalized carbon fibers; (iii) a thin metal coating; (iv) a conductive polymer; (v) carbon nanotubes; (vi) metal nanoparticles; or (vii) a combination thereof.

Another embodiment of the invention provides a damage detection system comprising: (a) a substrate; completely or partially covered with (b) a layer comprising an electrically conductive material forming a continuous or noncontinuous layer; wherein layer (b) is electrically connected to (c) an electrical signal generator adapted to deliver electrical signals to layer (b); and (d) a detector circuit electrically linked to (b) and adapted to detect the electrical signals in layer (b) and process data about the electrical signals in layer (b) to identify damage to the substrate (a) or electrically conductive material (b); wherein the electrically conductive material of layer (b) is (i) a composite material comprising a conductive polymer having amino groups or cationic groups, and carbon nanotubes covalently modified with acidic groups; (ii) a material comprising metalized carbon fibers; or (iii) a thin metal coating. The substrate in particular embodiments is an electrically conductive wire core, preferably overlayed by an electrically insulative material layer. In other embodiments, the substrate is not an electrically conductive wire core. It may, for instance, be a window, a surface of a photovoltaic panel, an outer surface of an airplane or spacecraft, or an outer surface of an inflatable object.

Some embodiments of the invention are directed to methods and systems for detecting damage to electrical wires, which may be wires with an outer conductive layer as described here, or conventional wires, e.g., with just an inner conductive core and an outer insulative layer.

These embodiments generally involve a method of detecting damage to an electrical wire comprising: (i) delivering one or more test electrical signals to a wire; (ii) detecting the test electrical signals to obtain electrical signal detection data; and (iii) processing the electrical signal detection data to detect damage to the wire.

One embodiment provides a method of detecting damage in an electrical wire comprising: (i) delivering one or more test electrical signals to (a) an outer electrically conductive material in a continuous or noncontinuous layer covering (b) an electrically insulative material layer that covers (c) an electrically conductive wire core; (ii) detecting the test electrical signals in the outer electrically conductive material layer (a) to obtain data about the test electrical signals in the outer electrically conducting material layer; (iii) processing the data to identify damage in the outer electrically conductive material layer, the electrically insulative material layer, or the wire core; wherein the wire is a live wire and the electrically conductive wire core carries an operating energy under a potential at least as large as the test electrical signals in layer (a) during the delivering and detecting steps.

One embodiment provides a method of detecting damage to an electrical wire comprising: (i) delivering a plurality of test electrical signals to a wire; (ii) detecting the test electrical signals to obtain electrical signal detection data; (iii) processing the electrical signal detection data by a method comprising integrating electrical signal detection data from the plurality of test electrical signals to detect damage to the wire; wherein the wire is a live wire carrying an operating energy under a potential at least 10 (in some embodiments at least 20 or at least 100) times larger than the potential of the test electrical signals during the delivering and detecting steps.

In some embodiments the detection method is carried out on a live wire carrying an operating energy.

In some embodiments of the methods of detecting damage to an electrical wire, the power for the step of delivering a test electrical pulse is harvested from the operating energy of the wire.

In some embodiments of the methods, the method of detecting damage is carried out on a system comprising a plurality of wires, e.g., a cable with several wires within the cable, and when damage is detected to the wire being tested, the operating energy is rerouted to a different wire in the system and the operating energy is shut down to the test wire.

Another embodiment provides a system for detecting damage to a wire, the system comprising: (a) a wire comprising an electrical conductor; (b) an electrical signal generator electrically linked to the electrical conductor and adapted to deliver a plurality of test electrical signals to the electrical conductor of the wire; and (c) a detector circuit electrically linked to the electrical conductor of the wire and adapted to detect the test electrical signals in the electrical conductor of the wire to obtain electrical signal detection data and to process the signal detection data by a method comprising integrating signal detection data from the plurality of signals to detect damage to the wire; wherein the wire is a live wire carrying an operating energy under a potential at least 20 (in some embodiments at least 100) times larger than the potential of the test electrical signals while the electrical signal generator is delivering the plurality of test electrical signals and the detector circuit is detecting the test electrical signals and processing the electrical signal detection data.

Another embodiment provides a wire damage detection system comprising: (a) an electrically conductive wire core; (b) an impact detection patch, fiber, or layer overlaying the wire core and comprising a triboluminescent material; optically linked to (c) a photovoltaic material that generates electrical current in response to light emission by the triboluminescent material; linked to (d) a detector adapted to detect current from the photovoltaic material and process information about the current to identify impacts to the electrical wire.

Another embodiment provides a method of detecting impact on a wire wherein the wire is part of a system comprising a plurality of wires, the method comprising: (a) detecting impact on the wire with an impact detection patch, fiber, or layer on or in the wire, the patch, fiber, or layer comprising a triboluminscent material that emits light in response to impact, by detecting the emitted light to obtain impact data.

DETAILED DESCRIPTION OF THE INVENTION

The term "operating energy" as used herein includes an electrical current or voltage that provides power to an electrical device or current or voltage that transmits information, e.g., in a wire whose purpose is to carry data. The term "operating energy" does not include electrical signals generated solely to test for damage to an electrical wire.

Figure 1:
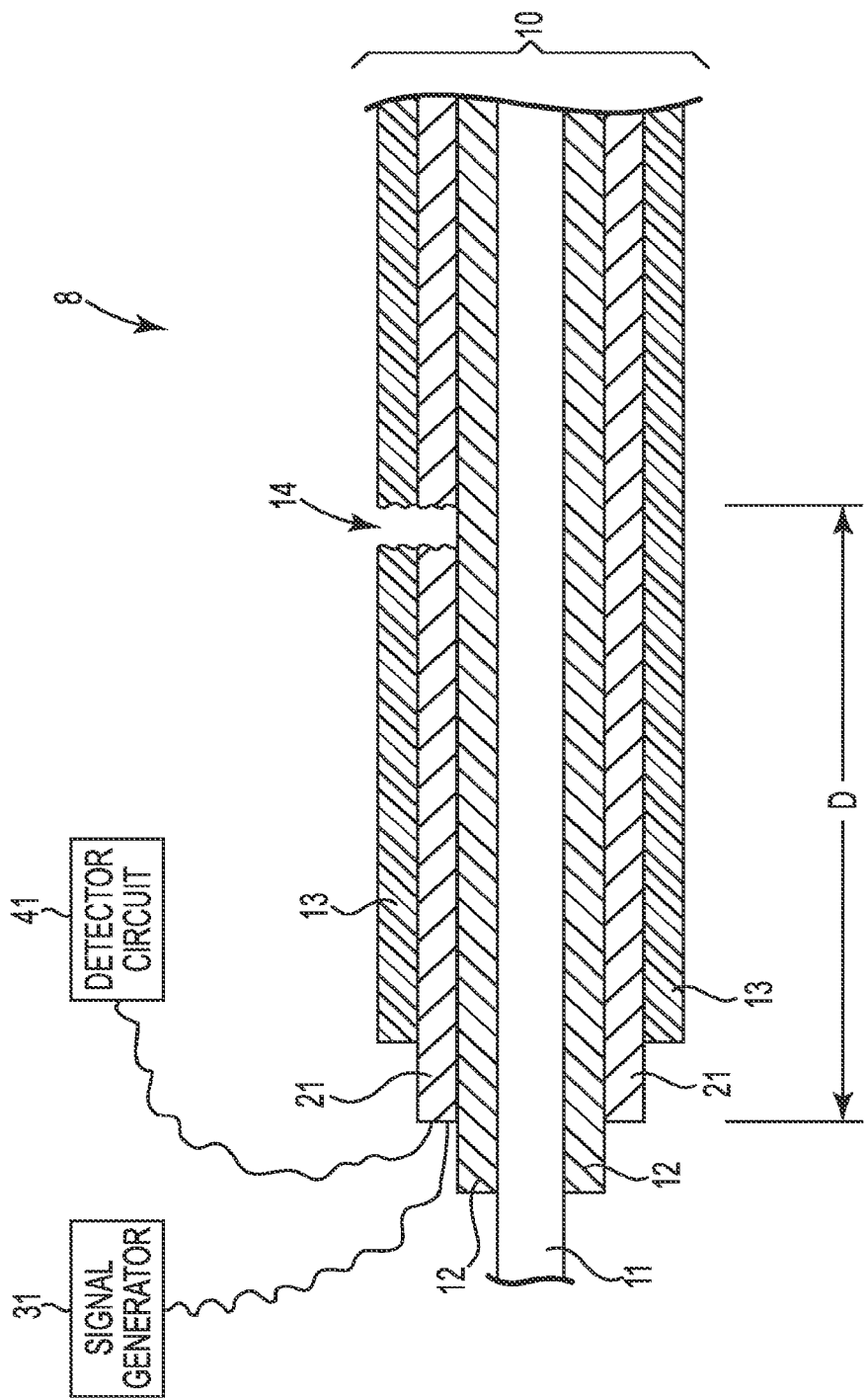
FIG. 1 is a schematic drawing of a damage detection system comprising an electrically conductive wire with an outer conductive detection layer, along with an electrical signal generator adapted to deliver electrical signals to the detection layer, and a detector circuit adapted to detect the electrical signals in the detection layer and process information about the detected signals to identify flaws in at least one layer of the system.

FIG. 1 shows an electrical wire of the invention for use in the systems for detecting damage to the wire. The wire 10 includes an electrically conductive wire core 11, which is for carrying the operating energy of the wire. The wire core 11 is surrounded by a layer 12 of an electrically insulative material. Covering the insulative layer 12 is an electrically conductive material layer 21. Preferably surrounding the electrically conductive material layer is another electrically insulative material layer 13.

FIG. 1 shows the wire of FIG. 1 as a part of a damage detection system. The damage detection system 8 includes an electrical signal generator 31 adapted to deliver one or more electrical signals to the detection layer 21 of electrically conducting material. A detector circuit 41 is also electrically linked to the electrically conductive detection layer 21 and adapted to detect electrical signals in layer 21.

FIG. 1 also shows a break 14 in the outer insulation layer 13 and the detection layer 21.

Figure 2:
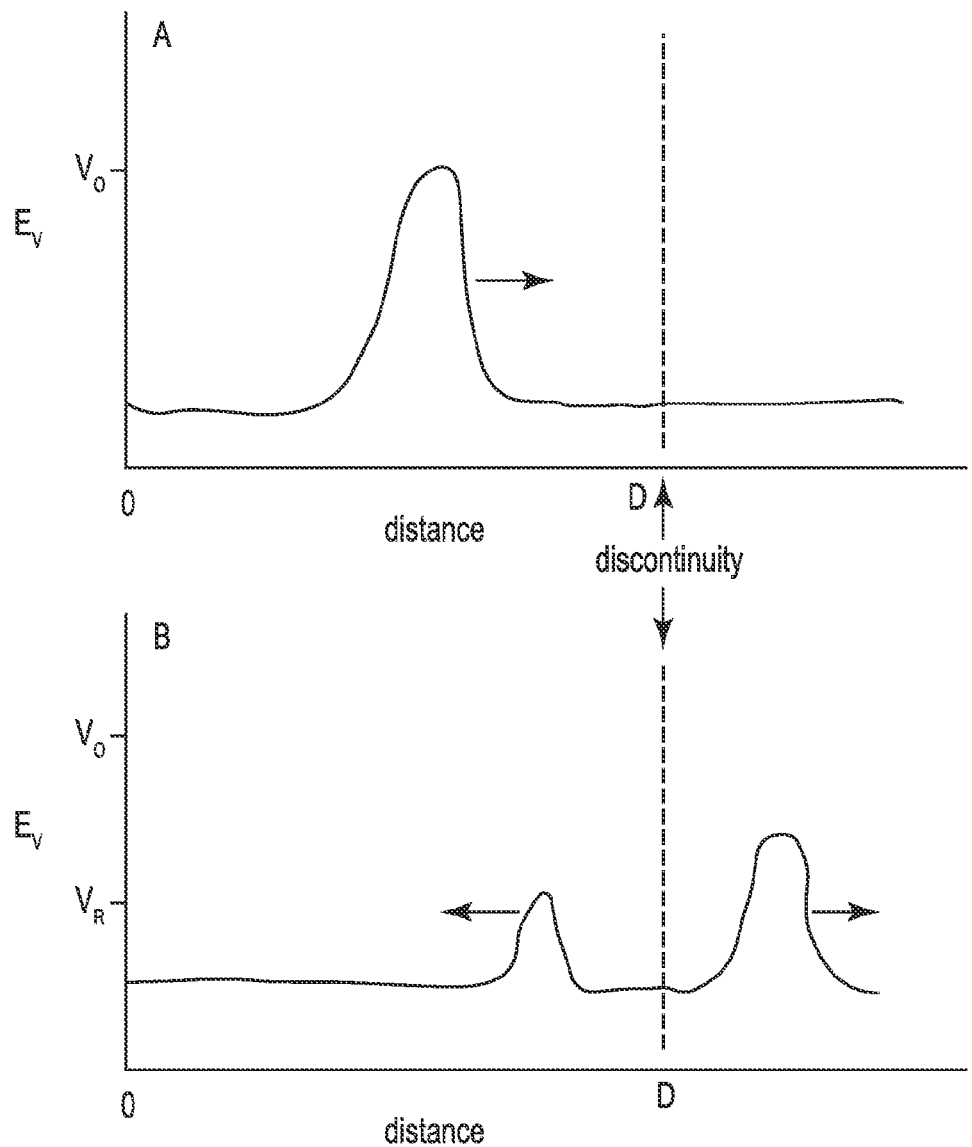
FIG. 2 is an idealized graph showing the movement of a voltage pulse in a conductive medium to detect damage or a discontinuity in the medium in time domain reflectometry.

A preferred method to detect damage to the detection layer 21 is time domain reflectometry (TDR). The mechanism of TDR is shown in FIG. 2. An electrical pulse (signal) of voltage $V_o$ is transmitted from an origin on the wire at distance zero (0). The pulse is shown in panel A moving rightward toward a discontinuity at distance D. When the pulse reaches point D, a portion of the pulse may pass through the discontinuity and a portion be reflected backwards. This is shown in panel B of FIG. 2. The reflected pulse of voltage $V_R$ that is less than $V_o$ and may be of opposite sign from $V_o$ moves back toward the origin at distance zero, and can be detected there. From the time the reflected wave takes to return to the origin, it is possible to determine the distance of the discontinuity from the point of origination of the pulse and point of detection of the reflected wave. The magnitude of reflection is referred to as the reflection coefficient $\rho$.

$$\rho = V_R/V_o \quad \text{Equation 1}$$

$$\text{and } \rho = (Z_t - Z_o)/(Z_t + Z_o) \quad \text{Equation 2}$$

where $Z_o$ is the characteristic impedance of the transmission medium (in this case the detection layer 21) and $Z_t$ is the impedance at the termination of the line or at a point of damage or discontinuity. If the conductive layer 21 is of uniform impedance and properly terminated, the entire transmitted pulse will be absorbed in the far-end termination and no signal will be reflected. Any impedance discontinuities will cause some of the incident signal to be sent back toward the source.

The damage can also be detected by other methods including standing wave reflectometry, frequency domain reflectometry, and resistive methods.

In a resistive method of detection, if at the point of damage 14 in FIG. 1 the conductive layer 21 makes electrical contact with a reference conductor (e.g., a ground), the distance D in FIG. 1 from the end of detection layer 21 where current generator 31 applies a voltage and detector circuit 41 detects a voltage, can be calculated by equation 3 below:

$$D = (V_m R_s)/(R_o(V_s - V_m)) \quad \text{Equation 3}$$

where $V_s$ is the voltage supplied by the current generator 31, $V_m$ is the voltage measured by detector circuit 41 at the end of the conductive layer 21. $R_o$ is the resistance per unit length of the conductive layer 21. $R_s$ is the fixed series resistance of the current generator 31. (U.S. Pat. No. 4,988,949). In this resistance layer, a constant voltage can be supplied as $V_s$ to the conductive layer 21. Transient breaks or damage to the conductive layer 21 can also be detected by detecting $V_m$ continuously over time and noting transient peaks or troughs in $V_m$ where $V_s$ is applied as a constant voltage.

One embodiment of the invention provides a damage detection system comprising: (a) an electrically conductive wire core, covered with (b) an electrically insulative material layer, completely or partially covered with (c) an electrically conductive material layer, covered with (d) an electrically insulative layer; wherein layer (c) is electrically connected to (e) an electrical signal generator adapted to deliver electrical signals to layer (c); and (f) a detector circuit electrically linked to (c) and adapted to detect the electrical signals in layer (c) and process data about the electrical signals in layer (c) to identify flaws in at least one layer of the system.

One embodiment provides a wire comprising: (a) an electrically conductive wire core, covered with (b) an electrically insulative material layer, completely or partially covered with (c) an electrically conductive material layer, covered with (d) an electrically insulative layer.

In preferred embodiments, layer (c) (the detection layer) is (i) a composite material comprising a conductive polymer having amino groups or cationic groups, and carbon nanotubes covalently modified with acidic groups or hydroxyls; (ii) a material comprising metalized carbon fibers; or (iii) a thin metal coating.

In other embodiments the detection layer is a composite material comprising a conductive polymer and metal nanoparticles.

In specific embodiments, the detection layer is (i) a composite material; (ii) a material comprising metalized carbon fibers; (iii) a thin metal coating; (iv) a conductive polymer; (v) carbon nanotubes; (vi) metal nanoparticles; or (vii) a combination thereof;

The detection layer is preferably a uniform layer completely covering the circumference of the wire (the underlying wire layers). It also preferably cores the entire length of the wire.

In particular embodiments, the detection layer is a material comprising metalized carbon fibers. Nickelized carbon fibers are commercially available from sources such as Conductive Composites Company, LLC (Midway, Utah) and Martek, Inc., (Chesterfield, Mo.). In that case, the nickel is applied to carbon fibers by chemical vapor deposition. Other metals can be used in place of nickel, such as copper and gold. Other methods of applying metal to a carbon fiber are known in the art, including electroplating, heated evaporation, electron beam evaporation, sputtering, and ion assisted deposition.

In particular embodiments, the metalized fibers are in the form of a carbon cloth coated with metal.

In particular embodiments, the detection layer is a carbon cloth coated with metal, and the metalized carbon cloth is further coated with a polymer adherent to the metal-coated cloth.

The polymer-coated metalized carbon cloth can be made remarkably thin. In some embodiments, it is less than 20 mils thick.

In one embodiment, the polymer coating is or comprises a polyimide.

In one embodiment, metalized carbon fibers or a metalized carbon cloth is or are contacted with a polyamic acid, and the polyamic acid is imidized to a polyimide on the fibers or cloth.

In particular embodiments, the metalized fibers are nickel-coated fibers. In other embodiments, they may be copper-coated, silver-coated, gold-coated, chrome-coated, or aluminum-coated.

The carbon fibers in the metalized carbon fibers can be or include carbon nanotubes. The nanotubes may be single-wall, double-wall, or multi-wall nanotubes.

In preferred embodiments, the carbon fibers are larger than 100 nm diameter, (i.e., not nanotubes). These conventional carbon fibers are available from commercial sources and can be made by heating a polyacrylonitrile fiber at 400-600° C. in an inert atmosphere to carbonize it.

In other embodiments, the detection layer is a thin metal coating. Preferably the metal coating is less than 20 microns thick in order to not add much weight to the wire and to not stiffen the wire. In other embodiments, the metal coating is less than 5 microns thick or less than 1 micron thick or less than 500 nm thick.

Some of the challenges to using a metal detection layer were the possible development of crosstalk, shielding, or arc tracing with the core conductive wire. Another concern was adding too much weight to the wire. Another concern was whether we could achieve good adhesion to the inner insulation layer. Poor adhesion could be a problem especially with vibration in aircraft or spacecraft or any device that moves or vibrates substantially. It is also important to have a consistent thickness to the detection layer so that conductivity is consistent throughout the layer in order to more easily distinguish damage to the conductive detection layer. If the conductive layer is inconsistent, the background signal noise will be large and any defect caused by damage would be difficult to distinguish from inherent defects or inconsistencies in the detection layer in its original state.

We have found that a very thin metal coating can be applied to wires by methods that are able to produce a consistent coating thickness with good adherence to the underlying insulation. We are also able to make layers with enough conductivity for use in detection yet thin enough that they do not add excessive weight or stiffness to the wire.

In particular embodiments, the thin metal coating is applied by spraying, sputtering, dip coating, chemical vapor deposition, plasma spray deposition, or electroplating.

In particular embodiments, the thin metal coating is applied by a non-aqueous metal deposition process.

The thin metal coating can also be a thin metal tape that is wrapped around the electrically insulative material layer (b). In specific embodiments, the thin metal coating is applied by wrapping a metallic tape over the inner insulation layer with no overlap of material. In other embodiments, the tape wrap has between 0-75% overlap. In some embodiments the tape may or may not contain an adhesive to improve the adhesion to the insulation layer (b), and may or may not contain an inner or outer polymer layer to improve functionality. The tape also may or may not contain an adhesive to improve adhesion to outer insulation layer (d). In specific embodiments the tape may contain a conductive adhesive to promote adhesion between detection layer overwraps.

In specific embodiments, the metallic tape may be copper, aluminum, gold, silver, platinum, nickel, or any other conductive metal.

In other embodiments, the conductive material of the damage detection layer is a composite material comprising (a) a conductive polymer having amino or cationic groups, and (b) carbon nanotubes covalently modified with acidic groups or hydroxyls.

In particular embodiments, the carbon nanotubes are modified with acidic groups. In other embodiments, with hydroxyls. The carbon nanotubes may be single-, double-, or multi-walled.

Conductive polymers have conductivities typically in the range of $10^{-1}$ to $10^2$ S/cm. Polyaniline, polypyrrole, and polythiophenes are the most common conductive polymers. Polyaniline is the most commonly used.

Polyaniline and polypyrrole have secondary amino groups. These can protonate to become positively charged and then can form an ionic interaction with a negatively charged deprotonated acidic group. Alternatively, non-ionized secondary amino groups of these polymers can form hydrogen bonds with acidic groups or hydroxyls.

Polythiophene is p-doped with the loss of an electron to become positively charged. Thus, in the p-doped state it has cationic groups as well and can form ionic interactions with negatively charged acidic groups.

Ionic and hydrogen bond interactions between acid groups or hydroxyls covalently attached to carbon nanotubes and amino or cationic groups on conductive polymers help to align the carbon nanotubes with the polymers, and also serve to bridge two different polymer strands and thereby increase the mechanical strength and thermal stability of the material over that of the pure conductive polymer.

Carbon nanotubes and metalized carbon nanotubes are conductive materials, and mixing carbon nanotubes with an inherently conductive polymer can increase the conductivity of the material relative to the conductive polymer alone.

Sulfonic acid is a preferred acidic group in these materials. Sulfonic acid is also a dopant that improves the conductivity of inherently conductive polymers. Thus, the acid-modified carbon nanotubes increase the conductivity of the material more than unmodified carbon nanotubes. The sulfonic acid interacts strongly with both the carbon nanotube and the polyaniline, thereby serving as an electron bridge between the two materials, while at the same time behaving as a dopant that increases the conductivity. This contributes to a more organized conductive path for electron transport.

The ionic and hydrogen bond interactions help to disperse and prevent agglomeration of the nanotubes. This also contributes to consistency and electrical conductivity of the composite materials.

The conductivity can be further increased by aligning the molecular chains. This can be achieved by producing fibers by wet-spinning and melt-spinning methods and film by tape casting and spin coating.

The composite conductive polymer/acid-modified nanotubes material can be extruded as a conductive detection layer surrounding the inner insulation layer of a wire.

One embodiment of the invention provides a composite material comprising: (a) a conductive polymer having amino or cationic groups, and (b) carbon nanotubes covalently modified with acidic groups.

In particular embodiments of the composite material, the composite material has an electrical conductivity of more than 100 S/cm, more than 1000 S/cm, or more than $10^4$ S/cm. In other embodiments, the composite material has an electrical conductivity of more than 1 S/cm.

In particular embodiments, the composite material is thermally stable at 200° C., 220° C., 240° C., 250° C., 260° C., or 300° C. Thermal stability refers to losing less than 5% mass with heating at that temperature in thermogravimetric analysis and not melting.

In particular embodiments, the composite material has a tensile strength of at least 3200 MPa.

In particular embodiments, the conductive polymer having amino groups or cationic groups is polyaniline. In other embodiments it is polypyrrole. In other embodiments it is polythiophene. In a more specific embodiment, it is p-doped polythiophene.

In particular embodiments, the carbon nanotubes are covalently modified with sulfonic acid groups. In other embodiments, they are covalently modified with carboxylic acid or phosphonic acid groups.

In particular embodiments of the wires, the detection layer has a resistance divided by length of less than 50 ohms/foot, less than 20 ohms/foot, less than 10 ohms/foot, less than 5 ohms/foot, less than 2 ohms/foot, less than 1 ohm/foot, or less than 0.5 ohms/foot, or less than 0.1 ohms/foot.

In particular embodiments of the wires, the electrically conductive material of the detection layer has a thermal stability of at least 200° C., at least 220° C., at least 240° C., 260° C., or at least 300° C.

In particular embodiments of the wires, the electrically conductive material layer (c) has a tensile strength of at least 3200 MPa.

In particular embodiments of the wires, the electrically insulative material of layer (b) or layer (d) or both is a polyimide. In other embodiments, one or both layers are fluoropolymer (e.g., TEFLON).

One embodiment of the invention provides a composite material comprising: electrically conductive metalized carbon fibers coated with an electrically insulative polymer.

In particular embodiments, the composite material is a cloth having an average thickness of less than 30 mils or less than 20 mils.

In a particular embodiment, the composite material is flexible.

In a particular embodiment, the composite material comprises an adhesive layer, wherein the material is an adhesive tape. In a more specific embodiment, the adhesive layer is the electrically insulative polymer.

In particular embodiments, the composite material is a tape.

In particular embodiments, the composite material is a foil.

In specific embodiments, the metalized carbon fibers are nickel-coated fibers. In other embodiments, they are copper-coated, silver-coated, gold-coated, chrome-coated, or aluminum-coated. The metal coating can also comprise two layers of metal, for instance nickel over copper.

In specific embodiments, the carbon fibers comprise carbon nanotubes. The carbon nanotubes in particular embodiments are multi-walled nanotubes. In other embodiments they are double-walled nanotubes. In other embodiments they are single-walled nanotubes.

In one embodiment of the damage detection system, the system is adapted to identify flaws in the system while wire core (a) carries operating energy.

In specific embodiments, the electrical signal generator is adapted to be powered by operating energy from the wire core.

In one embodiment, the detector circuit is adapted to identify the location of a flaw in the system to an accuracy of 20 cm or less. In other embodiments, it is adapted to identify the location of a flaw in the system to an accuracy of 3% of the distance of the flaw from the electrical signal generator.

In particular embodiments, the electrical signal generator is adapted to deliver electrical signals (preferably electrical pulses) of a potential of less than 100 mV, and the detector circuit is adapted to integrate results from a plurality of signals (e.g., at least 5 signals, at least 20 signals, at least 100 signals, or at least 1000 signals) to detect flaws in the system.

In particular embodiments, the signal generator (e) is adapted to deliver electrical pulses and the detector circuit (f) is adapted to detect reflected pulses from layer (c) to identify flaws in at least one layer of the system.

In particular embodiments, the signal generator and detector circuit are adapted to generate and detect signals by standing wave reflectometry or time domain reflectometry.

In particular embodiments of the system, wire (a) is adapted to carry alternating or direct current under a potential of at least 2 V, at least 5 V, at least 10 V, at least 20 V, at least 50 V, or at least 100 V, and signal generator (e) is adapted to deliver electrical pulses under a potential of less than 2 V, less than 500 mV, less than 100 mV, or less than 50 mV.

In particular embodiments of the wires, electrically conductive detection layer (c) completely covers insulative layer (b).

The substrate for the damage detection systems described herein is typically an electrically conductive wire core with an overlying insulative layer between the wire core and the detection layer. But the damage detection system can be applied to other substrates as well.

Thus, another embodiment of the invention provides a damage detection system comprising: (a) a substrate; completely or partially covered with (b) a layer comprising an electrically conductive material forming a continuous or noncontinuous layer; wherein layer (b) is electrically connected to (c) an electrical signal generator adapted to deliver electrical signals to layer (b); and (d) a detector circuit electrically linked to (b) and adapted to detect the electrical signals in layer (b) and process data about the electrical signals in layer (b) to identify damage to the substrate (a) or electrically conductive material (b); wherein the electrically conductive material of layer (b) is (i) a composite material comprising a conductive polymer having amino groups or cationic groups, and carbon nanotubes covalently modified with acidic groups or hydroxyls; (ii) a material comprising metalized carbon fibers; (iii) a thin metal coating. In specific embodiments, the substrate is not an electrically conductive wire core; or (iv) a composite material comprising a conductive polymer and metal nanoparticles.

In other embodiments, the electrically conductive material of layer (b) is (i) a composite material; (ii) a material comprising metalized carbon fibers; (iii) a thin metal coating; (iv) a conductive polymer; (v) carbon nanotubes; (vi) metal nanoparticles; or (vii) a combination thereof;

The substrate may be in specific embodiments, an exterior surface of an aircraft or spacecraft. This allows detection of damage to the surface during flight.

In other embodiments, the substrate is a window.

In specific embodiments, the substrate is a structural material.

The substrate may be flexible. It may be a textile or fabric. In a specific embodiment the substrate is an inflatable habitat (e.g., an inflatable structure for human habitation in outer space).

In specific embodiments, the substrate is not electrically conductive (is electrically insulative). In other embodiments, the substrate is electrically conductive. Where the substrate is electrically conductive, it may be necessary or desirable to include a layer of electrically insulative material between the substrate and layer (b) of electrically conductive material.

In a specific embodiment, layer (b) comprises: (b) (i) strips of an electrically conductive material wherein the strips are at least partially electrically isolated from each other; covered with (b) (ii) a layer of an electrically insulative material; covered with (b) (iii) strips of an electrically conductive material wherein the strips are at least partially electrically isolated from each other; wherein the strips of (b) (i) are oriented in a different direction from the strips of (b)(iii). Typically, the strips of (b)(i) and the strips of (b)(iii) are oriented at right angles to each other.

Each of the separate strips is preferably partially or fully electrically isolated from each other so that the user is able to more easily determine which strip is damaged and therefore locate the damage, e.g., by identifying which strip in the (x) direction is damaged, and which strip in the (y) direction is damaged, the user can map the damage to particular (x, y) coordinates.

One embodiment of the invention provides a method of detecting damage in an electrical wire comprising: (i) delivering one or more test electrical signals to (a) an outer electrically conductive material in a continuous or noncontinuous layer covering (b) an electrically insulative material layer that covers (c) an electrically conductive wire core; (ii) detecting the test electrical signals in the outer electrically conductive material layer (a) to obtain data about the test electrical signals in the outer electrically conducting material layer; (iii) processing the data to identify damage in the outer electrically conductive material layer, the electrically insulating material layer, or the wire core; wherein the wire is a live wire and the electrically conductive wire core carries an operating energy under a potential at least as large as the test electrical signals in layer (a) during the delivering and detecting steps.

In specific embodiments of the method of detecting damage, the method comprises delivering test electrical signals in step (i) and detecting the test electrical signals in step (ii) and processing the data in step (iii) by time domain reflectometry.

In other embodiments, the method comprises delivering test electrical signals in step (i) and detecting the test electrical signals in step (ii) and processing the data in step (iii) by standing wave reflectometry or frequency domain reflectometry.

In particular embodiments, step (i) comprises delivering a plurality of electrical pulses of current at a potential of less than 100 mV; and step (ii) or (iii) comprises integrating reflected current or voltage from a plurality of pulses to identify damage.

In particular embodiments, step (i) comprises delivering a plurality of electrical pulses of current at a potential of less than 100 mV; step (ii) comprises detecting reflected electrical pulses in the outer electrically conductive material layer; and step (iii) comprises integrating data from a plurality of pulses to identify damage.

In particular embodiments, step (iii) comprises processing the data to identify the location of the damage.

These embodiments generally involve a method of detecting damage to an electrical wire comprising: (i) delivering one or more test electrical signals to a wire; (ii) detecting the test electrical signals to obtain electrical signal detection data; (iii) processing the signal detection data to detect damage to the wire.

One embodiment provides a method of detecting damage to an electrical wire comprising: (i) delivering a plurality of test electrical signals (preferably pulses) to a wire; (ii) detecting the test electrical signals to obtain electrical signal detection data; (iii) processing the electrical signal detection data by a method comprising integrating detection data from the plurality of test electrical signals to detect damage to the wire; wherein the wire is a live wire carrying an operating energy.

In specific embodiments, the wire is a live wire carrying an operating energy under a potential at least 10 times, at least 20 times, or at least 100 times larger than the potential of the test electrical signals during the delivering and detecting steps.

In some embodiments the detection method is carried out on a live wire carrying an operating energy. In some embodiments of the methods of detecting damage to an electrical wire, the power for the step of delivering one or more test electrical signals is harvested from the operating energy of the wire.

In some embodiments of the methods, the method of detecting damage is carried out on a system comprising a plurality of wires, e.g., a cable with several wires within the cable, and when damage is detected to the wire being tested, the operating energy is rerouted to a different wire in the system and operating energy is shut down to the test wire.

Figure 3:
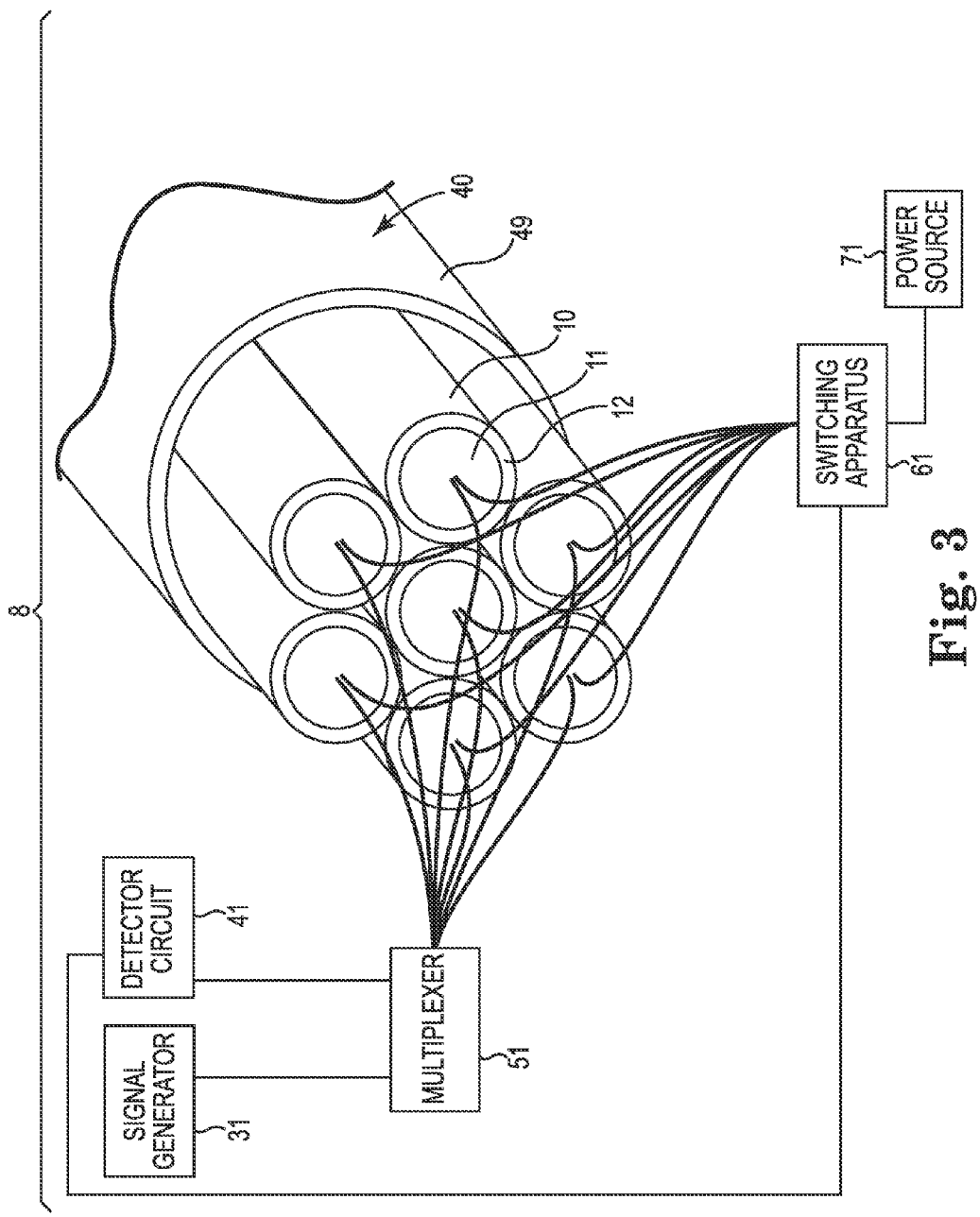
FIG. 3 is a schematic drawing of another damage detection system comprising a cable system with several electrically conductive wires, and circuitry to send test current into the wires and detect damage to the wires, and switch working and test current between the wires.

FIG. 3 shows a damage detection system 8 for detecting damage to wires within a cable 40 comprising several wires 10. Each wire 10 has a electrically conductive core 11 and an insulative layer 12 surrounding the core conductor 11. The system includes an electrical signal generator 31 that is a pulse generator electrically linked to the electrical conductor 11 via a multiplexer 51 and adapted to deliver a plurality of test electrical pulses to the electrical conductor 11 of the wire. The multiplexer switches connections between different wires in the system 40 so each wire can be tested in turn.

A comparison is typically needed to test the electrical conductor. The comparison is to a separate reference conductor that also receives an electrical pulse at the same time as the test electrical conductor. The reference conductor may be, for instance, a different wire core in the bundle of wires, or a conductive shield of the cable in the cable wall surrounding the wires in a cable. Electrical current is delivered to both the test conductor and the reference conductor and detected in both. The detected electrical signals in the two conductors are compared to detect damage in the test conductor.

A detector circuit 41 is electrically connected to the electrical conductor 11 of a wire 10 and is adapted to detect current or voltage in the electrical conductor 11 from the test electrical signals. The detector circuit may integrate electrical signal detection data from a plurality of pulses or signals to detect damage to the wire. The detector circuit typically includes a microprocessor. But it may be or include another device, such as a Field Programmable Gated Array, as described in Example 5.

In other embodiments, the wire may have an outer conductive layer 21 as shown in FIG. 1, and the electrical conductor receiving the test electric current may be the outer conductive layer instead of the wire core.

In specific embodiments, the wire is a live wire carrying operating energy under a potential at least 100 times larger than the potential of the test electrical signals while the signal generator is delivering the plurality of test electrical pulses and the detector circuit is detecting the current from the test electrical pulses and processing the current detection data.

Each wire in a system comprising a plurality of wires may be tested sequentially. A multiplexer 51 switches connections between wires to allow testing of each wire sequentially in a system. When damage is detected to one wire, operating energy may be switched from that wire to another wire in the system, e.g., a spare wire that was not previously carrying an operating energy. A switching apparatus 61 may be adapted to carry out the switching of operating energy from a power source 71.

The detector circuit may detect electrical signals at the same end of the wire as the signal generator or it may detect the signals at a different point on the wire, e.g., at the opposite end of the wire.

In particular embodiments, the signals are detected and processed by time domain reflectometry. In time domain reflectometry, electrical pulses are generated at known times, and the reflections are detected. From the time difference between propagation of the pulse and detection of the reflection, the distance from the origin to the discontinuity that generated the reflection can be determined (using the fact that electricity propagates at the speed of light).

In other embodiments, the signals are detected and processed by frequency domain reflectometry. In frequency domain reflectometry, the electrical signals are sinusoidal waveforms. The reflected signals will be the same frequency as the incident signals, but different in phase. The positions of peaks of individual cycles can be translated to distance to the discontinuity causing the reflection.

In specific embodiments of a method of detecting damage to an electrical wire comprising: (i) delivering a plurality of test electrical signals to a wire; (ii) detecting the test electrical signals to obtain electrical signal detection data; and (iii) processing the electrical signal detection data by a method comprising integrating detection data from the plurality of electrical signals to detect damage to the wire; wherein the wire is a live wire carrying an operating energy; the wire is a test wire in the system comprising a plurality of wires; step (i) comprises delivering a plurality of test electrical signals from an origin electrical unit to the test wire at a first end of the test wire; steps (ii) and (iii) together comprise monitoring an opposite end of the test wire for the test electrical signals with a terminus electrical unit to obtain electrical signal detection data and transmitting the electrical signal detection data through a separate communication wire in the plurality of wires to the origin electrical unit; integrating the signal detection data in the origin electrical unit after receiving the signal detection data from the terminus electrical unit; and processing the integrated signal detection data to detect damage to the test wire.

In particular embodiments of the methods of damage detection, the method of damage detection further comprises storing the signal detection data or the processed signal detection data to memory and time stamping the stored data to detect and record intermittent damage to the wire.

In specific embodiments, the wire is in a mechanical housing, and the method of detecting damage to the wire further comprises: detecting movement of the mechanical housing or the wire to obtain movement data; and recording and time stamping the movement data to memory; and correlating the time stamped electrical signal detection data with the time-stamped movement data. For instance, the mechanical housing may be cable wall 49 in FIG. 3. In other embodiments, the mechanical housing may be a wing or a wall of an airplane or spacecraft. Movement data can be obtained by, for instance, an accelerometer mounted on the mechanical housing.

In a specific embodiment, the damage detection method further comprises: detecting impact on the wire with an impact detection patch, fiber, or layer on or in the wire, the patch, fiber, or layer comprising a triboluminscent material that emits light in response to impact, by detecting the emitted light to obtain impact data; recording and time stamping the impact data to memory; and correlating the time-stamped impact data with the time-stamped electrical signal detection data.

Figure 4:
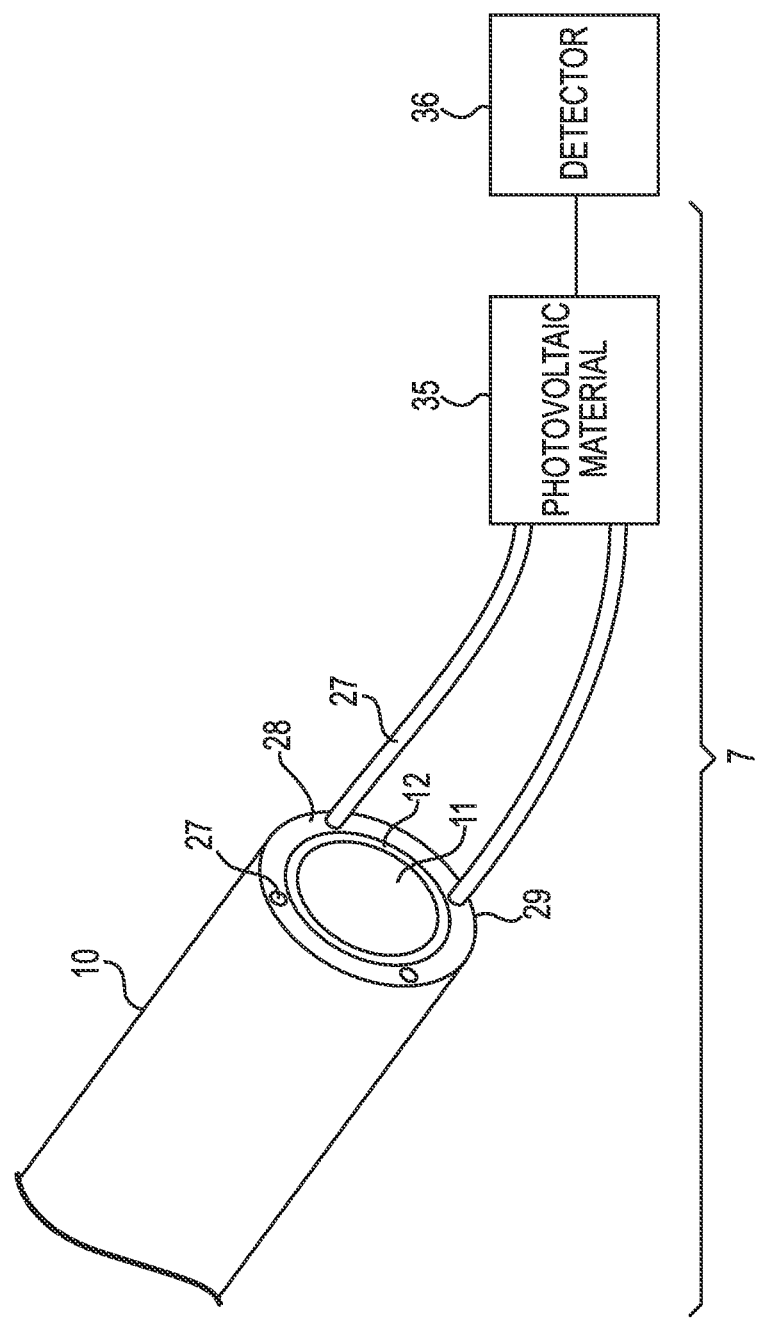
FIG. 4 is a drawing of an impact detection system involving a wire with a triboluminsecent impact detection component.

FIG. 4 shows a wire damage detection system that detects impacts to a wire. The system 7 includes a wire 10 having an electrically conductive core 11, surrounded by an insulative layer 12. Outside the insulative layer in this example are four fiber optic cables 27 in a layer comprising triboluminescent material 28. The triboluminescent material and fiber optic cables 27 are held in place by a covering layer 29. The fiber optic cables 27 transmit light emitted by the triboluminescent material 28 to photovoltaic material 35. The photovoltaic material 25 produces an electrical current in response to any light coming through the fiber optic cables 27, and the electrical current, which is indicative of an impact on the triboluminescent material 28, is transmitted to and detected by detector 36.

The term "impact" as used above includes any transient force, including ripping, scratching, cutting, striking, etc. Triboluminescent materials emit light in response to these forces. The light emission appears to be caused by breaking chemical bonds and a consequential separation and reunification of electrical charges. Many materials are triboluminescent, including sucrose crystals, and the adhesive layers of some tapes. The emitted light may not be in the visible spectrum. For instance, sucrose emits mostly in the ultraviolet. Wintergreen LIFESAVERS candy are famous for being triboluminscent. In that case, sucrose in the candy emits ultraviolet light when the candy is crushed and sucrose's emission is absorbed by wintergreen, which in turn fluoresces in the visible range.

In particular embodiments of the systems for detecting damage, wherein the system comprises a plurality of wires, the system further comprises: a multiplexer electrically linked to the plurality of wires, the electrical signal generator and the detector circuit and adapted to switch the wire receiving the test pulse from among the plurality of wires.

In particular embodiments of these systems, wherein the electrical signal generator is electrically linked to the electrical conductor at a first end of the test wire and is part of an origin electrical unit; (a) the detector circuit comprises (i) a terminus electrical unit electrically linked to the electrical conductor at a second end of the test wire and adapted to receive test electrical signal after they pass from the first to the second end of the test wire and obtain test electrical signal detection data, and electrically linked to a second end of a communication wire separate from the test wire and adapted to transmit test electrical signal detection data from the second end of the communication wire to a first end of the communication wire; and (ii) an origin detector circuit electrically linked to the first end of the communication wire and adapted to receive test signal detection data from the terminus electrical unit through the communication wire and adapted to process the test electrical signal detection data to detect damage to the test wire; and the system further comprises (1) a power source electrically linked to an (a) end of the test wire and adapted to deliver operating energy to the test wire; (2) a load device electrically linked to a (b) end of the test wire and adapted to receive operating energy from the test wire and use the operating energy to perform an operation; and (3) a switcher electrically linked to the plurality of wires, the power source, and the load device, and adapted to switch the wire connecting the power source and the load device from the test wire to a different wire in the plurality of wires if damage to the test wire is detected.

Embodiments of the invention will now be illustrated by the following examples, which are intended to illustrate different embodiments of the invention but not limit the scope of the invention.

EXAMPLES

Example 1

Nickel-Coated Carbon Fiber Cloth

We found that in order to detect damage to the conductive layer 21, an electrical resistance of approximately 50 ohms was required over whatever distance was being monitored. An inherently conductive polyaniline was obtained with a resistance of 49 ohms per foot. But this was found difficult to reproduce for deposition onto a wire insulation layer.

Nickel-coated (nickelized) carbon cloths were obtained from Conductive Composites Company (Midway, Utah) and evaluated for detection layer applications.

Table 1 lists the conductivity measurements and amounts of nickel coating on the cloths. The carbon cloth squares were 5×5 inches, and conductivity was measured across the length of a square, over 5 inches. The uncoated cloth had a mass of 0.13 g.

TABLE 1

Conductivity Measurements for Nickel-Coated Carbon Cloth.

| Milligrams of nickel coating per sheet | Conductivity ($\Omega$/square) |
| --- | --- |
| 0 | 9 |
| 10 | 1.5 |
| 11 | 0.8 |
| 35 | 0.2 |
| 43 | 0.15 |

Polymer Coating of Nickelized Carbon Cloth.

Figure 5:
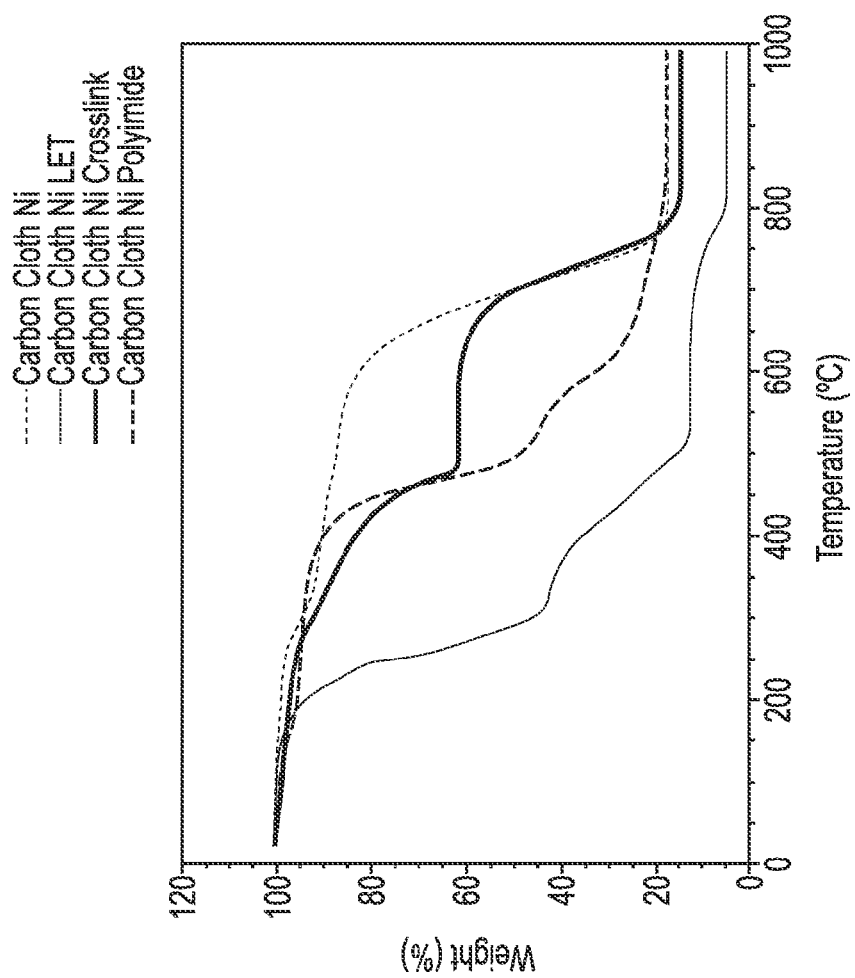
FIG. 5 shows thermogravimetric analysis data showing degradation of nickelized carbon cloth and polymer-coated nickelized carbon cloth with temperature.

Strips of the nickelized carbon cloth were coated with a conducting polymer formulation obtained from Crosslink (St. Louis, Mo.) (PAC 1007), a commercially available liquid electrical tape (LET), or a low-melt polyimide. Thermal decomposition data was obtained before (data not shown) and after UV exposure. Samples were exposed for 96 hours at 340 nm, 0.68 W/m$^2$, and 50° C. Thermogravimetric analysis (TGA) data of the samples after UV exposure is shown in FIG. 5. The polyimide formulation had the best thermal stability beyond 300° C.

For further testing, a square of nickel-coated carbon cloth was immersed in a quantity of low-melt polyamic acid solution. The solvent was removed and the polymer/cloth film heated to 150° C. for an hour to imidize the polyamic acid to the polyimide. Surface resistivity tests of both sides of this film indicated that significant conductivity remained at the surface. This means fibers of the cloth were still protruding above the surface of the film. A second layer of polyamic solution was cast and cured on each side of the polyimide/cloth construct. After the second coat, surface resistivity was very high. Strips of this film 2" long×7/16" wide were cut and shaped into sleeves. The strips can be used as a wrap to produce a conductive detection layer. The overall thickness of the conductive cloth composite film was measured at between 12 and 15 mils. The film adhered well to the wire. Flammability testing showed the polyimide/nickel cloth composite did not have a significant increase in flammability over the base polyimide. At 1/8 inch thick, the material ignited and burned longer than the base polymer itself, but it still self-extinguished, resulting in a V-0 rating.

Figure 6:
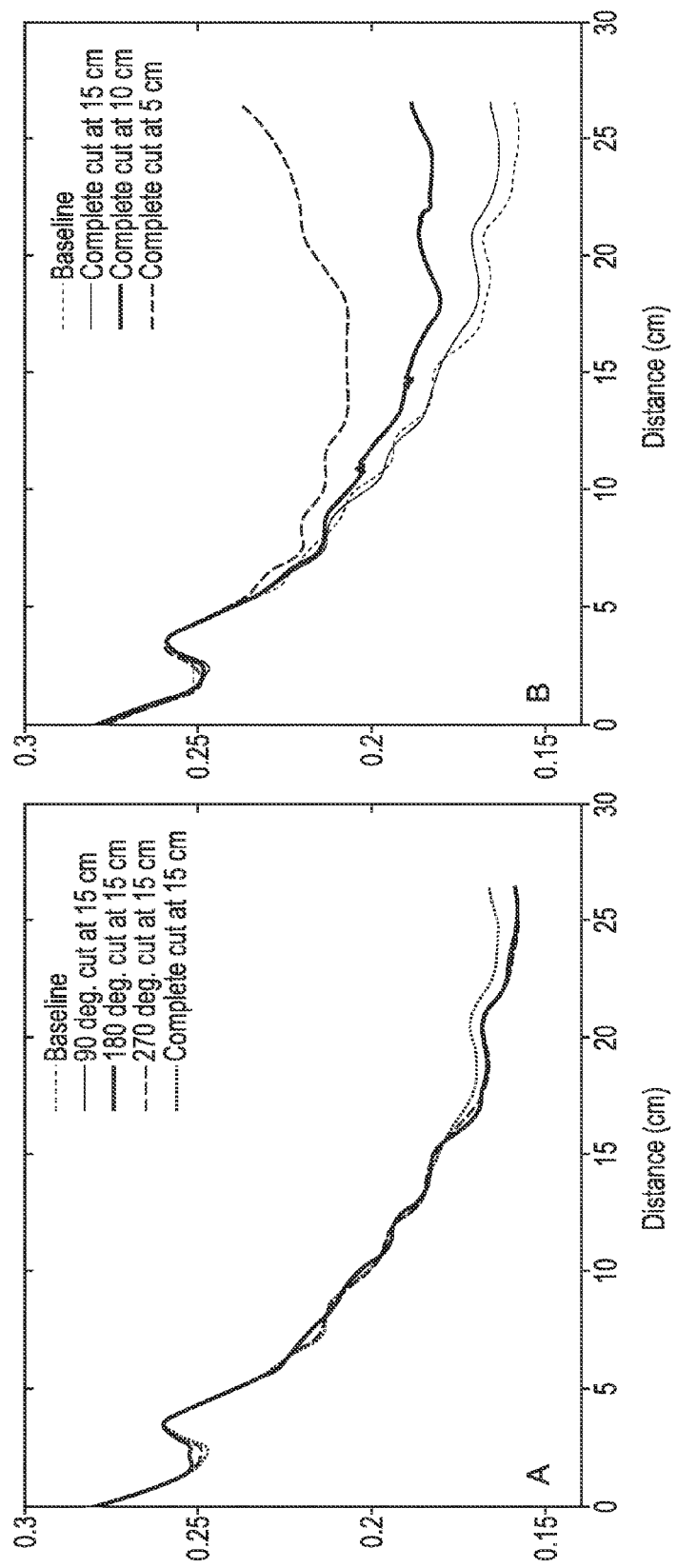
FIG. 6 shows time domain reflectometry (TDR) waveforms to detect damage to a wire with a detection layer of nickel-coated carbon cloth, coated with polyimide. In panel A, waveforms of the intact wire and wire with the detection layer cut at 5, 10, and 15 cm from the pulse source are shown. In panel B, TDR waveforms of intact wire, and wire with the detection layer cut over 90 degrees, 180 degrees, or 270 degrees of the detection layer, or a complete 360 degree cut of the detection layer. The graphs are plots of relative amplitude of the electrical signal (voltage or current) versus time.

A demonstration wire with a detection layer of nickel-coated cloth coated with LET was constructed with a length of 20 cm and 9-10$\Omega$ resistance. TDR testing of the demonstration wire indicated that it was possible to identify complete cuts through the detection layer at 5, 10, or 15 cm (FIG. 6B). Another wire was tested with a 90 degree cut (1/4 of the circumference of the wire cut through the detection layer), a 180 degree cut (1/2 of the circumference of the wire cut through the detection layer), a 270 degree cut, and a complete cut of the detection layer, all at 15 cm. Only the complete cut of the detection layer could be easily distinguished (FIG. 6A).

Example 2

Nickel-Coated Carbon Fibers

Figure 13:
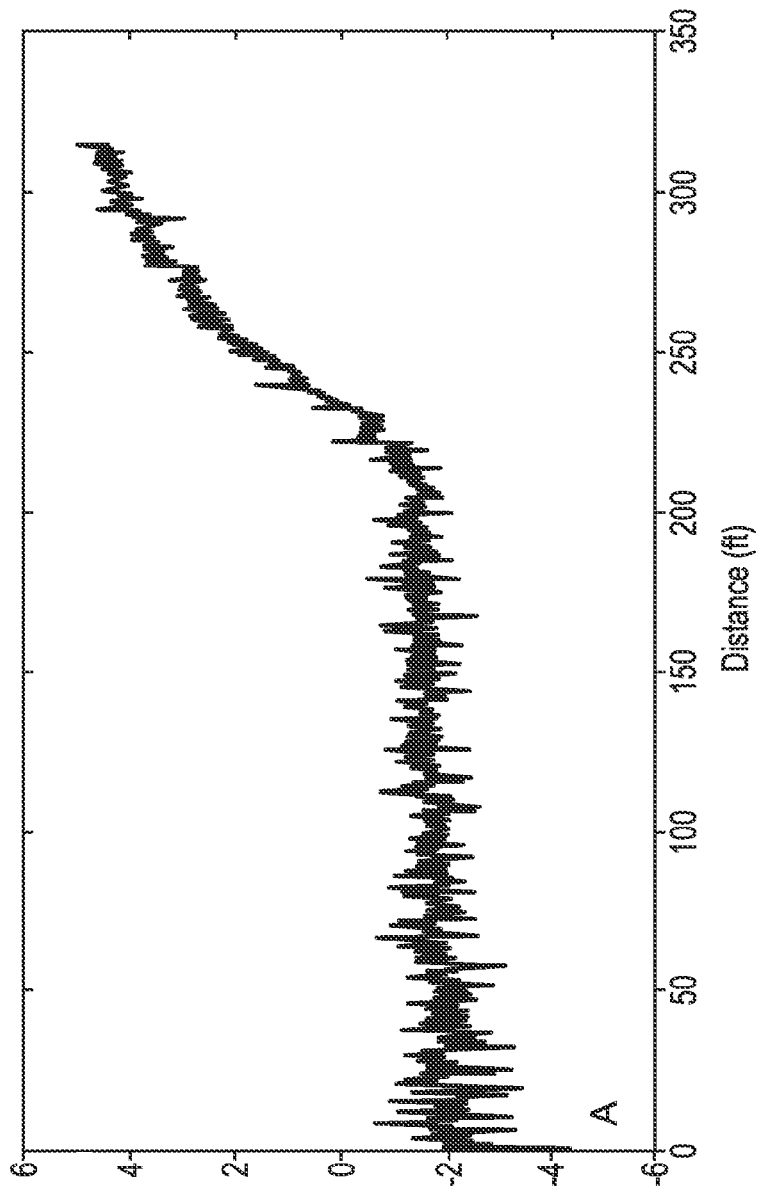
FIG. 13 shows a TDR waveform taken of a 207-foot wire with nickel-coated carbon fibers as the detection layer, with 100% damage to the detection layer at 197 feet distance from the origin, as described in Example 2.

Nickel-coated carbon fibers were obtained from various commercial vendors. These contain nickel coated onto a ribbon of carbon fibers via chemical vapor deposition (CVD). The fibers contained 2-63% nickel by weight. TGA showed that the nickel-coated fibers were stable to over 300° C. A 250-foot wire construct was prepared using 40%, 62%, and 63% nickel carbon (NiN—C) fibers. Strands of these fibers were wrapped around the inner insulation material of the wire using a tape wrap machine with 0, 25, 33, 50, and/or 66% ribbon overlap. One of two methods were employed to manufacture the outer insulation: (1) tape insulation material, i.e. Teflon, was wrapped over the NiN—C fibers and sintered at temperatures above 900° F. or (2) FEP insulation material was extruded over the NiN—C fibers using a horizontal single screw extruder. TGA analysis showed the nickel-coated fibers were stable to over 900° C. Using TDR, damage to the detection layer was detectable at levels between 10% and 100% damage at lengths up to 197 feet (FIG. 13 shows the damage 63% NiN—C fiber at 197-foot damage over a 207-foot wire with Teflon wrapped inner and outer insulation).

Example 3

Conductive Metal Tapes

Conductive metal tapes were wrapped at 0, 25, and 50% overlap onto the inner insulation layer of a standard wire type using a tape winding machine. One of two methods were employed to manufacture the outer insulation: (1) tape insulation material, i.e. Teflon, was wrapped over the metallic tape and sintered at temperatures above 900° F. or (2) FEP insulation was extruded over the metal tape using a horizontal single screw extruder. Tapes of copper or aluminum 3 mil thick were favorable based on their flexibility and conductivity. Improving draw tension of the tapes during wrapping eliminated the need for an adhesive layer.

Example 4

Conductive Composite Tapes

A conductive adhesive with nickel-coated carbon fibers was applied as a sleeve or tape around a 6-foot 12-gauge wire. The wrap was further covered with an insulation layer on the outside to decrease shorts during testing. Enough uncoated fibers were left at each end for connection during TDR testing. The detection layer of the 6-foot wire had a resistance of 27 ohms.

Figure 7:
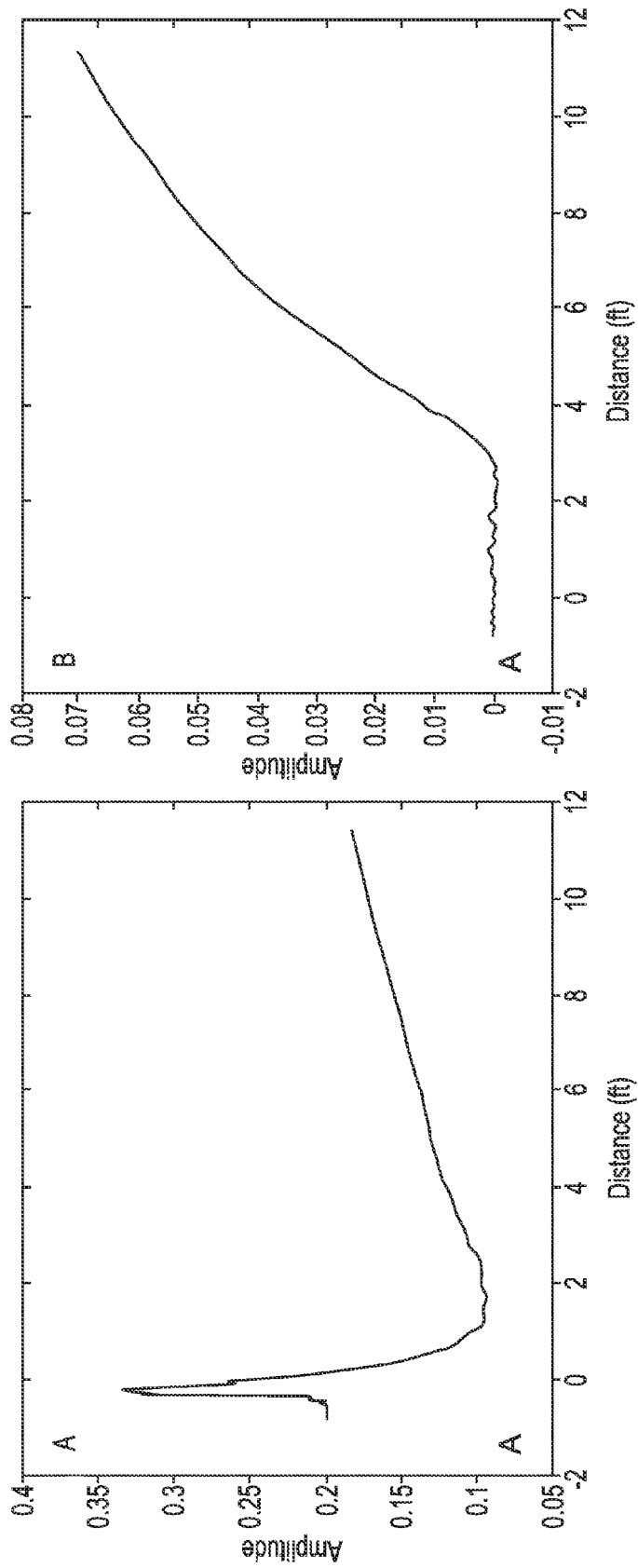
FIG. 7 shows the TDR waveforms of a wire with nickelized carbon fibers as the detection layer. TDR of the intact wire is shown in panel A. TDR of wire with the detection layer cut completely at 3 feet is shown in panel B.

The 6-foot wire with a detection layer of conductive tape with nickel-coated carbon fibers was tested with TDR in straight configuration, bent, or cut at 3-feet distance from the input signal. TDR did not detect bending. But complete cut of the detection layer at 3 feet was detected (FIGS. 7A and 7B).

Example 5

Thin Metal Layer

The addition of a second conductive metal layer (as the detection layer 21) may impose crosstalk, shielding, or arc tracking problems. Weight and detection layer adhesion to the inner insulation layer were primary concerns. Poor adhesion could especially be a problem during the vibration and thermal cycling that a wire experiences during launch and reentry of a spacecraft, and during takeoff and landing of an airplane.

The desired standards for the detection layer were: (1) the metallic detection layer should adhere to the underlying polymer insulation layer, (2) the resistance should be less than 50 Ohms over the length to be tested for TDR, (3) the added weight should be minimal, (4) the detection layer should be a concentric and uniform coating to avoid false positive readings, and (5) the detection layer should withstand bending without damage or detection via TDR.

Aluminum

Aluminum was deposited on a polyimide-insulated Shuttle wire by ion assisted deposition (IAD). The wire was suspended in a VEECO 775 E-Beam Evaporation Chamber (Veeco Instruments, Inc., Plainview, N.Y.). The Veeco metal evaporation chamber uses an electron beam evaporator that fires a high-energy beam from an electron gun to boil a small spot of material, allowing lower vapor pressure materials to be deposited with extreme precision and uniformity. A cryogenic pump regulates operating pressures less than $10^{-8}$ torr. To increase uniformity for 3D substrates, a planetary substrate fixture rotates inside the evaporation chamber.

A uniform metallic layer 100 nm thick was deposited onto the inner insulation layer. Some wire samples were fully coated with a uniform layer over the circumference of the wire, while other samples were coated on only one side or coated on two sides but not completely covering the entire circumference.

Scanning electron microscopy with electron dispersion spectroscopy (SEM-EDS) was taken of candidate areas for optical characterization and elemental analysis. SEM-EDS confirmed that aluminum was present at approximately 150 nm thickness. Delamination testing was performed on fully and half-coated wires by baking the samples at 200° C. for 2 hours. Optical microscopy pictures of the wires before and after heating were identical. Environmental testing was performed using ASTM G154. The aluminum coating was partially removed after 4 hours of UV and 50% humidity exposure. Resistivity of the aluminum layer was greater than 300 $\Omega$/ft. We attributed this low conductivity of the aluminum detection layer to corrosion, as verified by X-ray photoelectron spectroscopy (XPS) (data not shown).

Gold

A 6-inch section of polyimide-coated 16-gauge Space Shuttle wire was placed into an RF sputterer for 15 minutes to apply a 400 nm gold layer. The resistivity of the thin gold layer measured via 4-point probe was less than 10 ohms/cm. The wire was then placed into an oven at 200° C. for two hours and did not show any visible signs of delamination. TGA of the metallic film was performed and the metallic layer was more thermally stable than the inner polymer insulating layer.

Crew Exploration Vehicle (CEV) certified wire with fluoropolymer insulation (hereinafter "CEV wire") was coated with gold using physical vapor deposition (PVD). The wire was wrapped around a mandrel and placed in a radio frequency (RF) evaporator. A 10 nm chromium layer was applied first to improve adhesion between the gold and fluoropolymer. This was followed by application of a 100 to 600 nm gold layer. In some trials, the sample configuration led to a shadowing effect on the metallic layer, which in turn diminished the appearance and conductivity of the layer. Due to the chamber size of the evaporator, a maximum of one 30-foot wire was prepared in this manner.

The measured conductivity of the 450-nm gold layer was 460 ohms over 28 feet (16.4 ohms/ft.) Cross-sectional SEM-EDS was performed to confirm the metallic composition and thickness. TGA was carried out to address thermal stability and samples indicated no delamination.

A 1-foot section of the wire was placed in an accelerated environmental chamber with UV lights and humidity. There was no visible or conductivity difference between exposed and unexposed samples.

Figure 8:
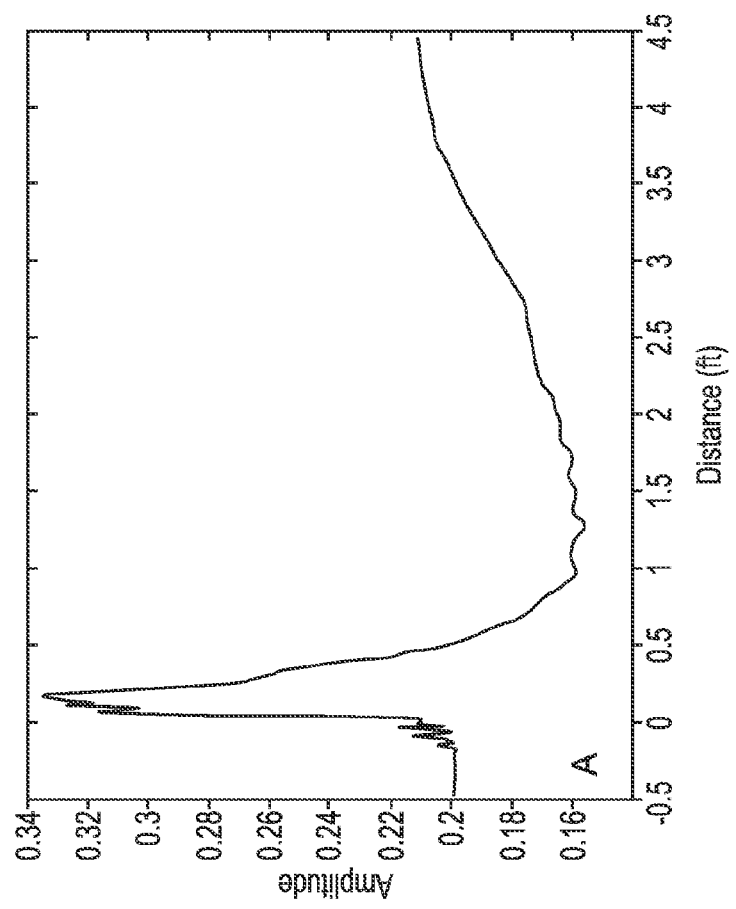
FIG. 8 shows the TDR waveform of an undamaged wire with a thin gold coating detection layer.
Figure 9:
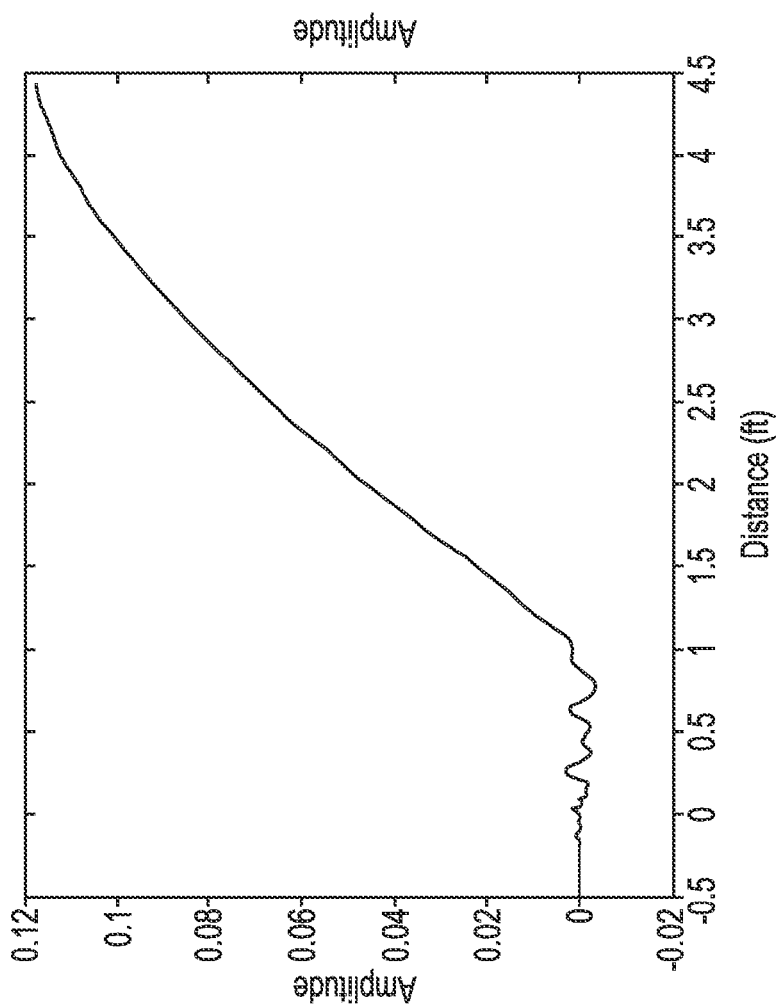
FIG. 9 shows the TDR waveform of a wire with a thin gold coating detection layer. In this example the detection layer is completely cut at 1 foot.

TDR testing of the wire was performed using a tabletop Agilent TDR. (Agilent Model 86100C Oscilloscope with TDR Module). TDR baseline waveform of the gold-coated wire is shown in FIG. 8. FIG. 9 shows the TDR waveform of a wire sample with the gold detection layer completely cut (with the core conductor intact) at 1 foot distance. The damage is easily identified. Less than complete damage to the detection layer, i.e., damage to only one side of the wire, was not detected.

Copper and Silver

A third set of samples was electroplated with copper onto both Shuttle and CEV wires. Copper was chosen due to its conductivity, mechanical properties, and strength. Because copper corrodes in ambient conditions, a nickel coating was deposited onto the 100 nm-thick electroplated copper layer. But the nickel coating became brittle and flaked off the copper.

Because of poor adhesion of the copper, silver was chosen instead of copper. Three ten-thousandths of an inch of silver was electroplated onto both CEV and Shuttle wire. A nitric acid etch was used on the edge of the inner insulation of the wires to remove any contamination and promote adhesion. The measured resistivity of the detection layer on both wire types was less than 0.5 ohms/foot using a 2-probe voltmeter.

Both silver samples passed delamination and TGA testing.

Cross-sectional SEM-EDS of the metallic layer indicated the presence of silver and copper. Copper was present from the electrolysis process to make the exterior of the nonconductive polymer insulation layer conducive for plating.

Accelerated environmental exposure testing showed no visual difference in appearance or conductivity.

TDR analysis was performed on each wire, and results were similar to those shown in FIGS. 8 and 9. A complete cut of the detection layer was easily detected. Partial cuts were not able to be detected. Some impedance (crosstalk) between the core conductor and the copper detection layer was seen. This may have been due to the etching of the insulation layer or the fact that the conductivity of the core and detection layers was similar. Thicker insulation between the layers would prevent the crosstalk.

Example 6

Comparative TDR Data

Wires wrapped with a detection layer of nickel-coated fibers as described in Example 2, carbon fibers (without nickel), or coated with a 450 nm coating of gold, prepared by chemical vapor deposition as described in Example 5, were tested by Time Domain Reflectometry (TDR) to determine whether it could detect breaks in the detection layer at various distances. The resistance of the detection layers in the wires was also determined.

Table 2 lists the results of the tests. N/A indicates that no test was conducted. A number of 100 indicates that damage was detected by TDR when the complete circumference of the detection layer was broken at the distance indicated. Likewise, 50 or 75 indicates that damage was detected when the detection layer over 50% of the circumference was cut. "Not visible" indicates that 100% damage was not detected.

TABLE 2

Time Domain Reflectometry (TDR) Test Results.

| Sample Name | Description | Resistance/ Length [Ohm/ft] | % Damage Visible on TDR- 70 ft | % Damage Visible on TDR- 30 ft | % Damage Visible on TDR- 15.52 ft | % Damage Visible on TDR- 10 ft | % Damage Visible on TDR- 8 ft | % Damage Visible on TDR- 2 ft | % Damage Visible on TDR- 1 ft |
|---|---|---|---|---|---|---|---|---|---|
| 90209-1 | Carbon Fiber Wrap | 12.0 | N/A | Not Visible | N/A | N/A | 100 | N/A | 100 |
| 90209-2 | 40% NiN/Carbon Fiber Wrap | 0.779 | 100 | N/A | N/A | N/A | 100 | N/A | 100 |
| 90209-3 | 40% NiN/Carbon Fiber Wrap- increased tension | 0.814 | N/A | N/A | N/A | Not Visible | 100 | N/A | 100 |
| 90209-4 | 40% NiN/Carbon Fiber Wrap- 25% overlap | 0.784 | N/A | N/A | Not Visible | N/A | Not Visible | N/A | Not Visible |
| 90209-5 | 40% NiN/Carbon Fiber Wrap- 50% overlap | 1.143 | N/A | 50 | N/A | N/A | Not Visible | N/A | Not Visible |
| 90209-6 | Gold Coated, Chemically Etched 22759/87 | 18.827 | N/A | N/A | N/A | N/A | Not Visible | 100 | 100 |
| 90209-7 | Gold Coated, Chemically Etched Polyimide- Insulated Wire | 11.186 | N/A | N/A | N/A | N/A | Not Visible | 100 | 100 |

TABLE 2-continued

Time Domain Reflectometry (TDR) Test Results.

| Sample Name | Description | Resistance/ Length [Ohm/ft] | % Damage Visible on TDR- 70 ft | % Damage Visible on TDR- 30 ft | % Damage Visible on TDR- 15.52 ft | % Damage Visible on TDR- 10 ft | % Damage Visible on TDR- 8 ft | % Damage Visible on TDR- 2 ft | % Damage Visible on TDR- 1 ft |
| --- | --- | --- | --- | --- | --- | --- | --- | --- | --- |
| 90209-8 | Gold Coated, Untreated PVC-Insulated Wire | 41.279 | N/A | N/A | N/A | N/A | 100 | 75 | 100 |
| 90209-9 | Gold Coated, Chemically Etched 22759/87 | 17.512 | N/A | N/A | N/A | N/A | Not Visible | 100 | 100 |
| 90209-10 | Gold Coated, Untreated Polyimide-Insulated Wire | 12.423 | N/A | N/A | N/A | N/A | Not Visible | 100 | 100 |
| 90209-11 | Gold Coated, Untreated PVC-Insulated Wire | 87.363 | N/A | N/A | N/A | N/A | Not Visible | 75 | 75 |

Example 7

Composite Material of Polyaniline and Sulfonic Acid Modified Carbon Nanotubes

Conductive polymers have conductivities typically in the range of $10^{-1}$ to $10^2$ S/cm. Polyaniline, polypyrrole, and polythiophenes are the most common conductive polymers. Polyaniline is the most commonly used.

In this example, carbon nanotubes are covalently modified with sulfonic acid groups, and the sulfonic acid-modified carbon nanotubes will be mixed with polyaniline (emeraldine) to form a composite material. The sulfonic acid groups form hydrogen bonds and ionic interactions with the amino groups of polyaniline. This specific interaction between the nanotubes is expected to help to disperse and prevent agglomeration of the nanotubes. Because of the length of the nanotubes, this can also help to align the nanotubes and the polymer. An additional advantage of this combination is that sulfonic acid is also a dopant that improves the conductivity of conductive polymers. Thus, mixing sulfonic acid-modified carbon nanotubes will improve the conductivity of the ICP more than unmodified carbon nanotubes would.

The ionic and hydrogen bond interactions between the sulfonic acid-modified carbon nanotubes and the polyaniline also serve to bridge polyaniline polymers in the material and thereby increase the mechanical strength and thermal stability of the material over that of the base polyaniline.

The sulfonic acid interacts strongly with both the carbon nanotube and the polyaniline, thereby serving as an electron bridge between the two materials, while at the same time behaving as a dopant that increases the conductivity. This contributes to a more organized conductive path for electron transport.

The conductivity can be further increased by aligning the molecular chains. This can be achieved by producing fibers by wet-spinning and melt spinning methods and film by tape casting and spin coating.

The composite polyaniline/sulfonic acid-modified carbon nanotubes can be extruded as a conductive detection layer surrounding the insulation layer of a wire.

Sulfonated carbon nanotubes are prepared as described in Peng, F., et al. (*Carbon* 43:2405-2408, 2005). Multiwall carbon nanotubes (MWNTs) with average inner and outer diameters of 8 and 15 nm, respectively, (1.00 g) are stirred with 50 ml $H_2SO_4$ (98 wt %) for 18 hours at 523 K under a flow on $N_2$ (80 ml-min$^{-1}$). After cooling to room temperature the product is washed repeatedly with distilled water until sulfate ions are no longer detected, and then dried in an air over at 393 K for 12 hours to obtain sulfonated carbon nanotubes. This procedure results in CNTs with a mass content of –503H groups of 15.4% (1.90 mol-g$^{-1}$) based on the uptake of ammonia. The morphology and structure of the nanotubes does not change with sulfonation. (Peng, F., et al. *Carbon* 43:2405-2408, 2005).

Polyaniline is polymerized in the presence of the sulfonated nanotubes. The sulfonated nanotubes can serve as a template to help align the polyaniline as it forms. In one polymerization method, aniline (0.2 ml) is mixed with 1 ml water and 10 mg sulfonated CNTs. Polymerization is initiated by addition of 1 ml ammonium persulfate (2.0 M). The ratio of aniline and sulfonated CNTs is varied along with the amount, if any, of water, in the polymerization to optimize the processability, conductivity, and thermal stability of the composite material.

Example 8

Cable Rerouter

Figure 10:
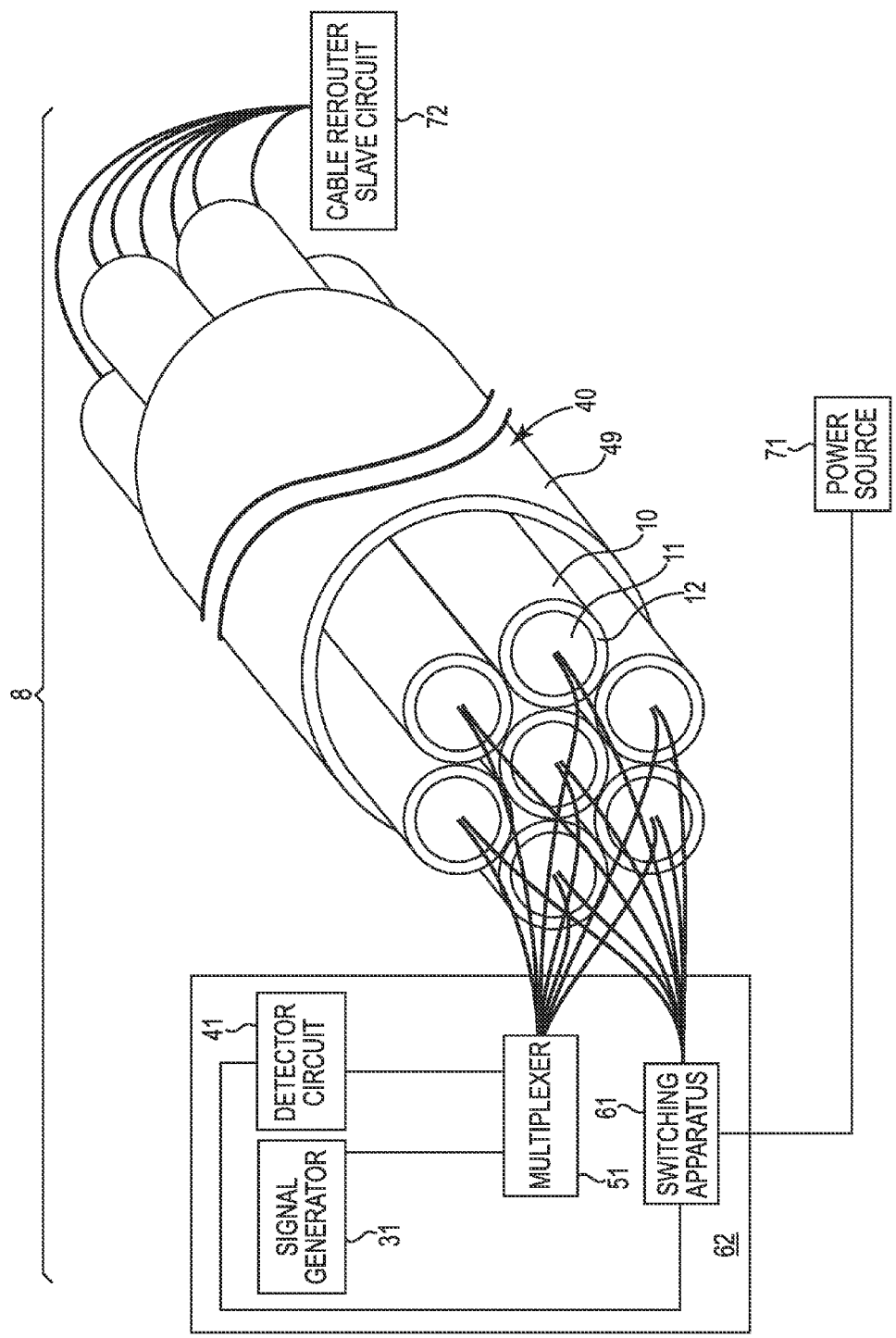
FIG. 10 is a schematic diagram of an embodiment of a cable rerouter of the invention described in Example 5.

FIG. 10 shows an example of a cable rerouter of the invention. The cable rerouter consists of (a) a master unit 62 that has a pulse generator 31, a multiplexer 51 to select wires for testing, a switcher 61, and a master unit detector circuit 41; and (2) a slave unit 72. The pulse generator 31 provides a plurality of step pulses that are applied to the multiplexer 51. The multiplexer 51 in turn routes each test pulse to one of the wires of the cable. The pulse signal then propagates until it reaches the cable rerouter slave circuit 72 at the opposite end of the wire. The slave circuit 72 monitors the wire and once it receives the signal it routes it back to the master unit 62 through a communication wire(s). The master unit detector circuit 41 in the master unit then determines the presence of the signal to indicate a good connection is in place. The absence of a series of test pulses is an indication of a faulty connection. A plurality of communication wires may be used to transmit the signal from the slave unit, so their individual state of health is not a determining factor for the analysis of the health of the wire under test.

The master unit sequentially scans all the wires selected as "actives" or "spares." The wires can be independently assigned to be "active" or "spares." Once an active wire has been labeled as failed, the master and the slave units communicate with each other and immediately route the operating energy that was flowing through the failed wire to one of the spare wires. The switcher 61 executes the switching of wires that carry operating energy, i.e., it changes the connections so a working current that was previously flowing through a wire determined to be damaged is moved to flow through a spare wire. This allows for the system to maintain integrity with a disruption shorter than 1 second. Handshaking between the master and slave units insures that the operating energy and the test pulse signals are rerouted to the proper end wires.

The test pulse is of small amplitude and requires multiple successive measurements to assess the integrity of the wire. The test pulses are usually in the range of 1 mV to about 2 V. For testing live wires, the test pulse should be maintained low in order not to interfere with signals being carried in the wire under test. The detection of such a small pulse is accomplished by using a synchronous integrator circuit, embedded in a Field Programmable Gate Array (FPGA) (in the master unit detector circuit). This allows us to discriminate between a large non-correlated signal and a small synchronous test pulse without interfering with the operation of the wire.

Example 9

TDR Device for Testing a Plurality of Wires

Figure 11:
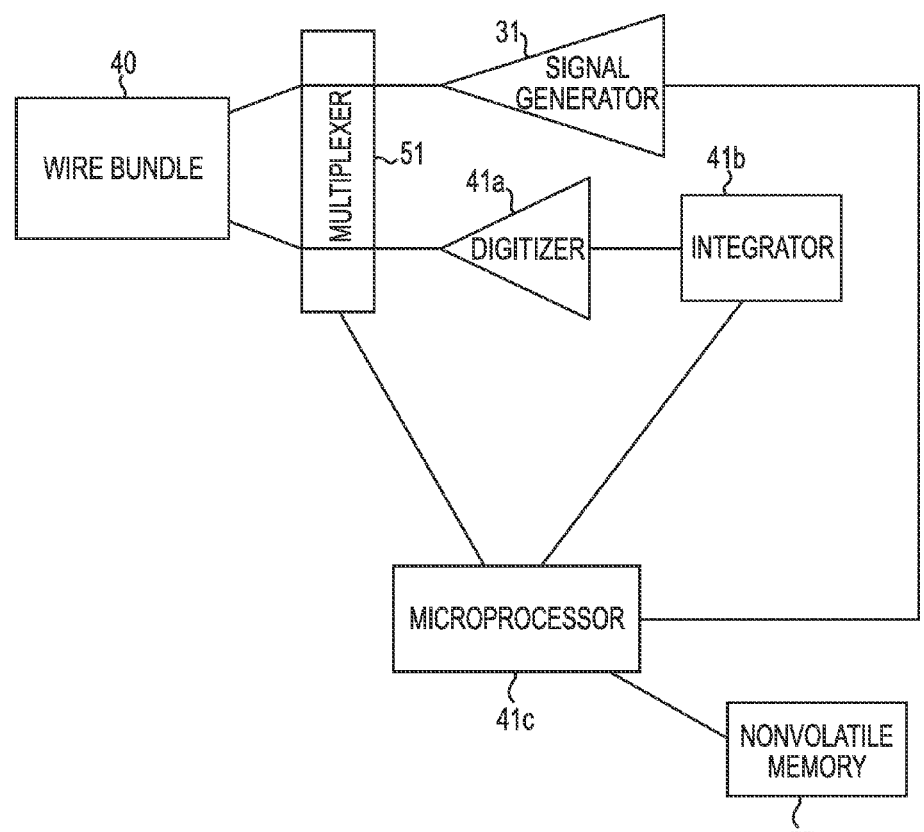
FIG. 11 is a schematic diagram of an embodiment of a TDR detection system for testing a plurality of conventional wires.

FIG. 11 shows an exemplary device for testing a plurality of wires. Pulse generator 31 transmits electrical pulses to a wire in wire bundle 40 and to a second wire or other electrical reference that serves as a comparison. The reference can be any other conductor or ground. Digitizer 41a, integrator 41b, and microprocessor 41c are components of a detector circuit. Digitizer 41a is linked to the same wire pair in wire bundle 40 as the pulse generator 31 and digitizes the signal (current or voltage) it detects in the test wire and comparison wire or ground. The output from digitizer 41a is transmitted to integrator 41b, which adds or integrates the digitized signal data from digitizer 41a. Integrator 41b and pulse generator 31 are both parts of a field programmable gate array (FPGA), a hardware device with several logical gates. Being a hardware device, the FPGA can perform the additions of digitized detected current data approximately $10^3$ times faster than a microprocessor could. The FPGA commands digitizer 41a when to start detecting current and digitizing the detected signal based on when the pulse is transmitted.

The integrated digitized detected signal data is transmitted from integrator 41b to a microprocessor 41c. Microprocessor 41c receives the data from integrator 41b and processes the signal detection data to identify damage to the wires and determine the location of the damage. The microprocessor 41c may store the processed or raw data in nonvolatile memory 77. The data may be stored as time-stamped data to correlate times of damage to other time stamped data, such as flight information where the wires are part of an aircraft or spacecraft. Microprocessor 41c, pulse generator 31, and signal digitizer 41a are electrically linked to a multiplexer 51 that, under command of the microprocessor 41c, selects a wire for receiving the test pulses and a reference wire for comparison. Microprocessor 41c controls the multiplexer 51. The wire pair (test wire and reference) receiving the test pulse and in which reflected current is detected are electrically connected to pulse generator 31 and current digitizer 41a through the multiplexer 51. A series of test pulses (typically from 64,000 pulses to 1 million pulses but may be as low as a few tens of pulses in off-line testing) is delivered to one test wire and a second comparison wire. Then the test pulses are rotated to a second test wire in the system (the comparison wire may also be rotated). Sixty-four wires can be tested in approximately one second. In other embodiments, the comparison conductor could be the shield of a cable rather than a second wire.

Preferably the series of test pulses are all of the same voltage amplitude. This simplifies detection calculations. The pulses are typically administered with constant time spacing between pulses. But that is not necessary. It is only necessary to know when the pulse goes out in order to begin detection of reflected signal at that time and know the time after pulse generation that reflections are detected.

At least some of the wires 10 in wire bundle 40 may be carrying an operating energy during testing. If damage to a wire is detected, the operating energy can be redirected by the microprocessor to a different wire, e.g., a spare wire in the bundle. The switching of operating energy between wires can be carried out also by multiplexer 51 in some embodiments. In other embodiments, a different switch circuitry is used that is connected to the microprocessor 41c.

Example 10

Impact-Detecting Wire

Figure 12:
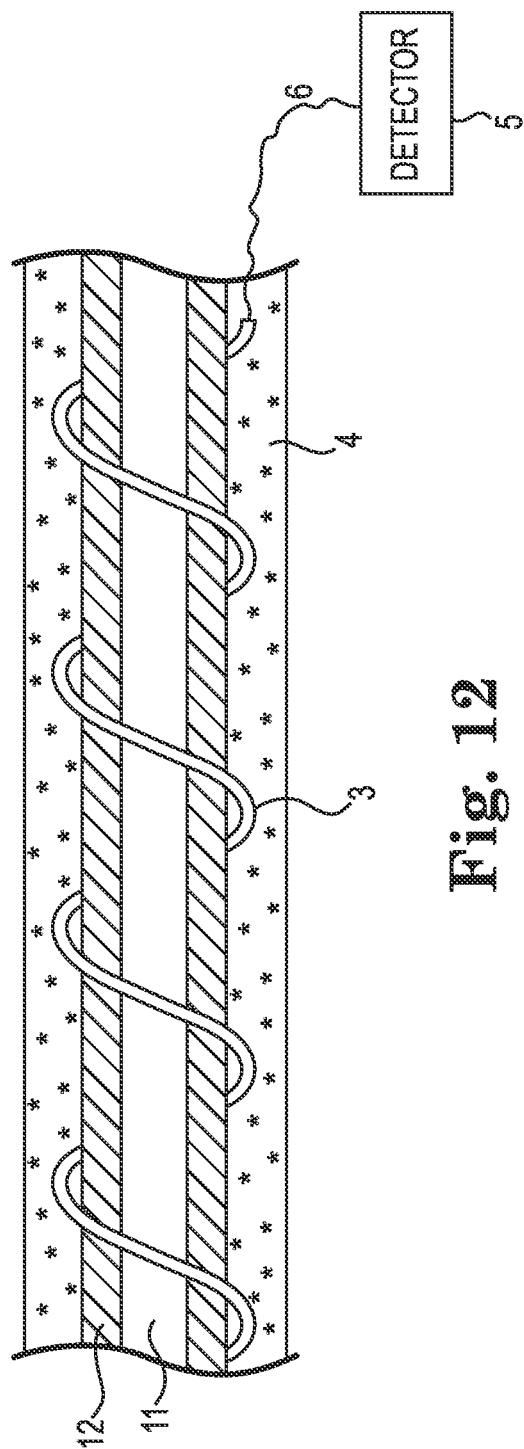
FIG. 12 is a schematic diagram of an embodiment of an impact detection system comprising a wire with a triboluminescent material.

FIG. 12 shows an impact-detecting wire system. A flexible photovoltaic material 3 is coiled around a conventional wire that includes an electrically conductive core 11 surrounded by an insulation layer 12. A polymer with entrapped triboluminescent crystals encases the photovoltaic coil 3. The triboluminescent crystals are shown as *s. When a strong impact strikes the wire, the crystals * emit light that is absorbed by the photovoltaic material 3 to create a current. The current is carried along coil 3 to reach the end of the wire where photovoltaic coil 3 is electrically connected to a detector 5 that detects the current, signaling that the wire has experienced an impact. To further narrow the location of the impact, in some embodiments the photovoltaic coil 3 is in separate sections, with each section connected to a separate conductive strip 6 within layer 4 that carries the current generated by the photovoltaic coil 3 to the end of the wire. The section in which the impact occurred is identified by which conductive strip carries the current that is detected.

All patents, patent documents, and other references cited are hereby incorporated by reference.

We claim:

1. A method of detecting damage in an electrical wire comprising:
   (i) delivering one or more test electrical signals to (a) an outer electrically conductive material in a continuous or noncontinuous layer covering (b) an electrically insulative material layer that covers (c) an electrically conductive wire core;
   (ii) detecting the one or more test electrical signals in the outer electrically conductive material layer (a) to obtain data about the one or more test electrical signals in the outer electrically conducting material layer;

(iii) processing the data to identify damage in the outer electrically conductive material layer, the electrically insulating material layer, or the wire core;

wherein the wire is a live wire and the electrically conductive wire core carries an operating energy under a potential at least as large as the one or more test electrical signals in layer (a) during the delivering and detecting steps;

wherein the method comprises delivering the one or more test electrical signals in step (i) and detecting the one or more test electrical signals in step (ii) and processing the data in (iii) by time domain reflectometry or frequency domain reflectometry.

2. The method of claim 1 wherein the method comprises delivering the test electrical signals in step (i) and detecting the test electrical signals in step (ii) and processing the data in (iii) by time domain reflectometry.

3. The method of claim 1 wherein the method comprises delivering the test electrical signals in step (i) and detecting the test electrical signals in step (ii) and processing the data in (iii) by frequency domain reflectometry.

4. The method of claim 2 wherein step (i) comprises delivering a plurality of electrical pulses at a potential of less than 100 mV; step (ii) comprises detecting reflected electrical pulses in the outer electrically conductive material layer; and step (iii) comprises integrating data from a plurality of pulses to identify damage.

5. The method of claim 1 wherein step (iii) comprises processing the data to identify the location of the damage.

6. A method of detecting damage to an electrical wire comprising:
(i) delivering a plurality of test electrical signals to a wire;
(ii) detecting the test electrical signals to obtain electrical detection data;
(iii) processing the electrical detection data by a method comprising integrating electrical detection data from the plurality of test electrical signals to detect damage to the wire;
wherein the wire is a live wire carrying an operating energy under a potential at least 20 times larger than the potential of the test electrical signals during the delivering and detecting steps.

7. The method of claim 6 wherein the wire is a live wire carrying an operating energy under a potential at least 100 times larger than the potential of the test electrical signals during the delivering and detecting steps.

8. The method of claim 6 where the power for the step of delivering the test electrical signals is harvested from the operating energy of the wire.

9. The method of claim 6 wherein the wire is part of a system comprising a plurality of wires; the method further comprising:
when damage is detected to the wire, rerouting operating energy from the wire to a different wire in the system and shutting down operating energy to the wire.

10. The method of claim 8 wherein the wire is part of a system comprising a plurality of wires; the method further comprising:
when damage is detected to the wire, rerouting operating energy from the wire to a different wire in the system and shutting down operating energy to the wire.

11. The method of claim 6 wherein the method comprises delivering test electrical pulses in step (i), detecting reflected test electrical pulses in step (ii) and processing electrical detection data in step (iii) by time domain reflectometry.

12. The method of claim 6 wherein the method comprises delivering electrical sinusoidal waveforms in step (i), detecting reflected sinusoidal waveforms in step (ii), and processing electrical detection data in step (iii) by frequency domain reflectometry.

13. The method of claim 6 further comprising storing the electrical detection data or the processed electrical detection data to memory and time stamping the stored data to detect and record intermittent damage to the wire.

14. The method of claim 13 wherein the wire is in a mechanical housing, the method further comprising:
detecting movement of the mechanical housing or the wire to obtain movement data; and recording and time stamping the movement data to memory; and correlating the time stamped electrical detection data with the time-stamped movement data.

15. The method of claim 6 wherein the wire comprises (a) an outer electrically conductive material in a continuous or noncontinuous layer covering (b) an electrically insulative material layer that covers (c) an electrically conductive wire core; and the method comprises:
(i) delivering a plurality of test electrical signals to outer conductive layer (a); and
(ii) detecting the test electrical signals in outer layer (a);
wherein the electrically conductive wire core (c) carries the operating energy during the delivering and detecting steps.

16. The method of claim 9 wherein the wire is a test wire in the system comprising a plurality of wires;
step (i) comprises delivering a plurality of test electrical signals from an origin electrical unit to the test wire at a first end of the test wire;
step (ii) comprises monitoring an opposite end of the test wire for the test electrical signals with a terminus electrical unit to obtain electrical detection data and transmitting the electrical detection data through a separate communication wire in the plurality of wires to the origin electrical unit; and
step (iii) comprises integrating electrical data from a plurality of test electrical signals to detect damage to the test wire.

17. A system for detecting damage to a wire, the system comprising:
a wire comprising an electrical conductor;
an electrical signal generator electrically linked to the electrical conductor and adapted to deliver a plurality of test electrical signals to the electrical conductor of the wire;
a detector circuit electrically linked to the electrical conductor of the wire and adapted to detect the test electrical signals in the electrical conductor of the wire to obtain electrical signal detection data and to process the signal detection data by a method comprising integrating signal detection data from the plurality of signals to detect damage to the wire;
wherein the wire is a live wire carrying an operating energy under a potential at least 20 times larger than the potential of the test electrical signals while the electrical signal generator is delivering the plurality of test electrical signals and the detector circuit is detecting the current from the test electrical pulses and processing the current detection data.

18. The system of claim 17 wherein the wire is a live wire carrying an operating energy under a potential at least 100 times larger than the potential of the test electrical signals while the electrical signal generator is delivering the plurality of test electrical signals and the detector circuit is detecting the electrical signals and processing the signal detection data.

19. The system of claim 17 wherein the system comprises a plurality of wires, the system further comprising:

a multiplexer electrically linked to the plurality of wires, the electrical signal generator and the detector circuit and adapted to switch the wire receiving the test signal from among the plurality of wires.

20. The system of claim 19 wherein the electrical signal generator is electrically linked to the electrical conductor at a first end of the wire and is part of an origin electrical unit;

the detector circuit comprises (i) a terminus electrical unit electrically linked to the electrical conductor at a second end of the test wire and adapted to receive test electrical signals after they pass from the first to the second end of the test wire and obtain test signal detection data, and electrically linked to a second end of a communication wire separate from the test wire and adapted to transmit test signal detection data from the second end of the communication wire to a first end of the communication wire; and (ii) an origin detector circuit electrically linked to the first end of the communication wire and adapted to receive test electrical signal detection data from the terminus electrical unit through the communication wire and adapted to process the test signal detection data to detect damage to the test wire; and the system further comprises:

an energy source electrically linked to an (a) end of the test wire and adapted to deliver operating energy to the test wire;

a load device electrically linked to a (b) end of the test wire and adapted to receive operating energy from the test wire and use the operating energy to perform an operation; and a switcher electrically linked to the plurality of wires, the energy source, and the load device, and adapted to switch the wire connecting the energy source and the load device from the test wire to a different wire in the plurality of wires if damage to the test wire is detected.

* * * * *